US012740298B2

(12) United States Patent
Wang et al.

(10) Patent No.: US 12,740,298 B2
(45) Date of Patent: Sep. 15, 2026

(54) DISPLAY PANEL WITH REFLECTION COMPENSATION STRUCTURES AND DISPLAY DEVICE

(71) Applicant: Wuhan Tianma Micro-Electronics Co., Ltd., Wuhan (CN)

(72) Inventors: Meihong Wang, Wuhan (CN); Yangzhao Ma, Wuhan (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 372 days.

(21) Appl. No.: 18/234,222

(22) Filed: Aug. 15, 2023

(65) Prior Publication Data

US 2024/0215382 A1 Jun. 27, 2024

(30) Foreign Application Priority Data

Dec. 27, 2022 (CN) ......................... 202211686942.0

(51) Int. Cl.
*H10K 59/80* (2023.01)
*H10K 59/131* (2023.01)
*H10K 59/35* (2023.01)
*H10K 59/88* (2023.01)

(52) U.S. Cl.
CPC ....... *H10K 59/8791* (2023.02); *H10K 59/131* (2023.02); *H10K 59/353* (2023.02); *H10K 59/80518* (2023.02); *H10K 59/878* (2023.02); *H10K 59/88* (2023.02)

(58) Field of Classification Search
CPC ........... H10K 59/80518; H10K 59/131; H10K 59/353; H10K 59/878; H10K 59/88; H10K 59/8791
See application file for complete search history.

(56) References Cited

U.S. PATENT DOCUMENTS

2022/0376013 A1 11/2022 Li et al.
2022/0415993 A1* 12/2022 Ryu ........................ H10D 86/60
2023/0006019 A1* 1/2023 Wang ................. H10K 59/1213
2023/0217717 A1* 7/2023 Lee ...................... H10K 59/122 257/40
2024/0237396 A1* 7/2024 Shang .................. H10K 59/121

FOREIGN PATENT DOCUMENTS

CN 113078196 A * 7/2021 ........... H10K 59/131
CN 114665039 A 6/2022

* cited by examiner

*Primary Examiner* — Eliseo Ramos Feliciano
*Assistant Examiner* — Brad A Knudson
(74) *Attorney, Agent, or Firm* — Anova Law Group, PLLC

(57) ABSTRACT

A display panel and a display device are provided. The display panel includes a substrate, a plurality of anodes disposed on a side of the substrate, and one or more reflection compensation structures. The plurality of anodes include a first anode. Along a direction perpendicular to a plane where the substrate is located, the first anode overlaps with a reflection compensation structure of the one or more reflection compensation structures. The reflection compensation structure is disposed on a side of the first anode facing towards the substrate.

20 Claims, 12 Drawing Sheets

100

43
42
Q
03
30/31
P
W
A
A'
K
K'
41
E
C
E'
F
V
V'
20
50
Second direction
First direction
R
G
B
D

DISPLAY PANEL WITH REFLECTION COMPENSATION STRUCTURES AND DISPLAY DEVICE

CROSS-REFERENCE TO RELATED APPLICATION

This application claims the priority of Chinese patent application No. 202211686942.0, filed on Dec. 27, 2022, the entirety of which is incorporated herein by reference.

FIELD

The present disclosure generally relates to the field of display technology and, more particularly, relates to a display panel and a display device.

BACKGROUND

In the wiring design of a display panel, wire-changing pads need to be disposed in the display panel. Due to the limited design space, some of the wire-changing pads have to be disposed under the anode, which will lead to poor flatness of the anode, and further lead to deteriorated display effect of the display panel.

SUMMARY

One aspect of the present disclosure provides a display panel. The display panel includes a substrate, a plurality of anodes disposed on a side of the substrate, and one or more reflection compensation structures. The plurality of anodes include a first anode. Along a direction perpendicular to a plane where the substrate is located, the first anode overlaps with a reflection compensation structure of the one or more reflection compensation structures. The reflection compensation structure is disposed on a side of the first anode facing towards the substrate.

Another aspect of the present disclosure provides a display device. The display device includes a display panel. The display panel includes a substrate, a plurality of anodes disposed on a side of the substrate, and one or more reflection compensation structures. The plurality of anodes include a first anode. Along a direction perpendicular to a plane where the substrate is located, the first anode overlaps with a reflection compensation structure of the one or more reflection compensation structures. The reflection compensation structure is disposed on a side of the first anode facing towards the substrate.

Other aspects of the present disclosure can be understood by those skilled in the art in light of the description, the claims, and the drawings of the present disclosure.

BRIEF DESCRIPTION OF THE DRAWINGS

To more clearly illustrate the embodiments of the present disclosure, the drawings will be briefly described below. The drawings in the following description are certain embodiments of the present disclosure, and other drawings may be obtained by a person of ordinary skill in the art in view of the drawings provided without creative efforts.

DETAILED DESCRIPTION OF THE DISCLOSURE

Reference will now be made in detail to exemplary embodiments of the disclosure, which are illustrated in the accompanying drawings. Wherever possible, the same reference numbers will be used throughout the drawings to refer to the same or the alike parts. It should be noted that unless specifically stated otherwise, the relative arrangements of components and steps, numerical expressions and numerical values described in the embodiments are not intended to limit the scope of the present disclosure.

The following description of at least one exemplary embodiment is merely illustrative, and is not intended to limit the scope of the present disclosure.

The described embodiments are some but not all of the embodiments of the present disclosure. It will be apparent to those skilled in the art that various modifications and changes can be made in the application without departing from the spirit or scope of the application. Based on the disclosed embodiments, persons of ordinary skill in the art may derive other embodiments consistent with the present disclosure, all of which are within the scope of the present disclosure. It should be noted that, the implementation manners provided in the embodiments of the present disclosure may be combined with each other if there is no contradiction.

Techniques, methods and devices known to persons of ordinary skill in the art may not be discussed in detail, but where appropriate, such techniques, methods and devices should be considered part of the description.

In all examples shown and discussed herein, any specific values should be merely construed as exemplary embodiment, and not as limitations. Therefore, other example of the exemplary embodiment may have different values.

Similar reference numbers and letters represent similar terms in the following Figures, such that once an item is defined in one Figure, it does not need to be further discussed in subsequent Figures.

Figure 1:
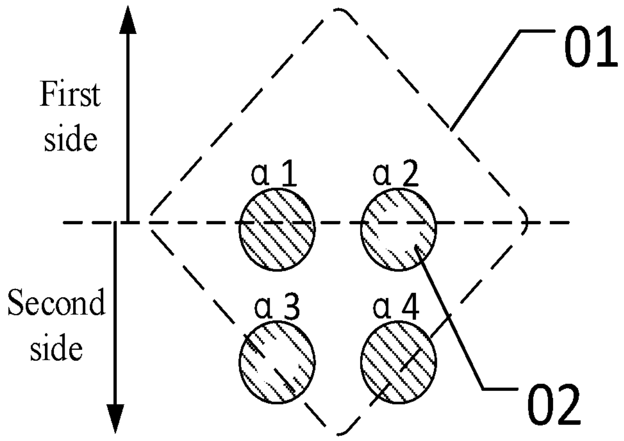
FIG. 1 illustrates a perspective view of a region corresponding to an anode of a display panel in relevant technology.

FIG. 1 illustrates a perspective view of a region corresponding to an anode of a display panel in relevant technology. Referring to FIG. 1, in the existing display panel, wire-changing pads 02 are disposed in a region 01 corresponding to at least a portion of the anode. The wire-changing pads 02 are not necessarily arranged substantially uniformly in the region 01 corresponding to the anode. For example, the wire-changing pads 02 arranged in the region corresponding to the anode are biased towards the second side of the region 01 corresponding to the anode, then the wire-changing pads 02 are not disposed in the first side that is opposite to the second side of the region 01 corresponding to the anode.

Moreover, the area of the wire-changing pads 02 is much smaller than the area of the region 01 corresponding to each anode. Therefore, for example, referring to FIG. 1, when the wire-changing pads 02 are disposed in the region 01 corresponding to the anode, at least a portion of the anode in the region 01 corresponding to the wire-changing pad 02 that is overlapped with a through-hole is likely to be recessed towards the substrate. When light is irradiated on the anode from the light-emitting surface of the display panel, the surface of a portion of the anode that is correspondingly provided with the pad may have a reflection effect on incident light different from the surface of another portion of the anode that is not provided with the pad, and the surface of a portion of the anode that is correspondingly provided with the wire-changing pad 02 overlapped with the through-hole may have a reflection effect on incident light different from the surface of another portion of the anode that is not provided with the wire-changing pad overlapped with the through-hole. Therefore, the display panel may suffer from the problem of poor display uniformity due to the difference in reflection effects on incident light of the first side and the second side in the region 01 corresponding to the anode.

It should be noted that the circular pattern in FIG. 1 including a hollowed-out part in the middle refers to the wire-changing pad 02 overlapped with the through-hole, such as the $\alpha 2$ wire-changing pad 02 and the $\alpha 3$ wire-changing pad 02. The $\alpha 1$ pad and the $\alpha 4$ pad does not overlap with the through-hole. Although FIG. 1 merely illustrates that the region 01 corresponding to the anode includes two wire-changing pads 02 overlapped with the through-hole, which is not limited by the present disclosure. It is also possible that each of the four circular pattern regions includes the wire-changing pad 02 overlapped with the through-hole. The region 01 corresponding to the anode includes any other quantity of the wire-changing pads 02 overlapped with the through-holes, such as three, five, six, and eight, which is not limited by the present disclosure.

It should be noted that referring to FIG. 1, when the wire-changing pad 02 overlapped with the through-hole is disposed, the wire-changing pad 02 overlapped with the through-hole can be formed by recessing a metal plate towards the substrate during fabrication.

Figure 2:
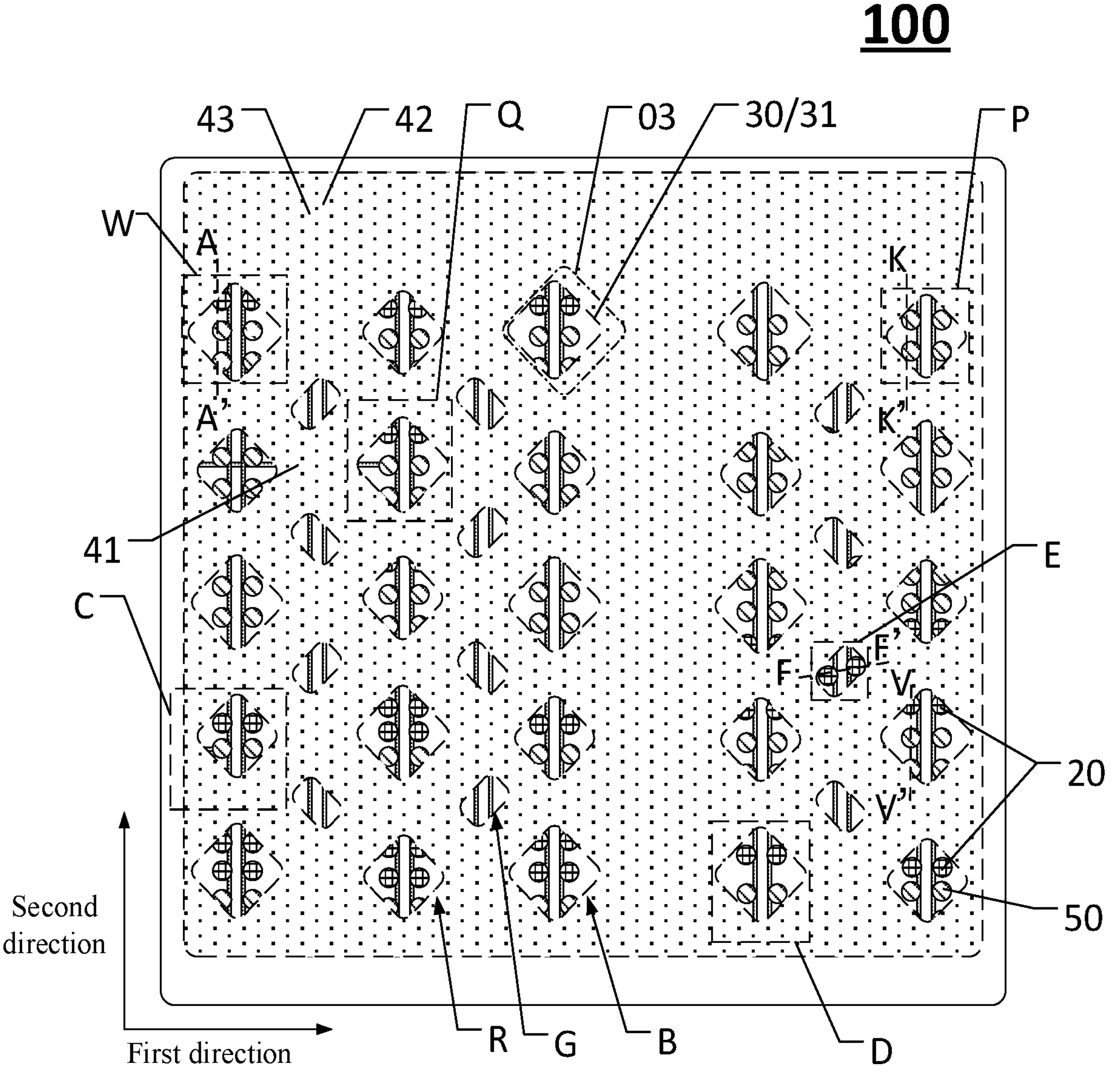
FIG. 2 illustrates a top view of an exemplary display panel consistent with disclosed embodiments of the present disclosure.
Figure 3:
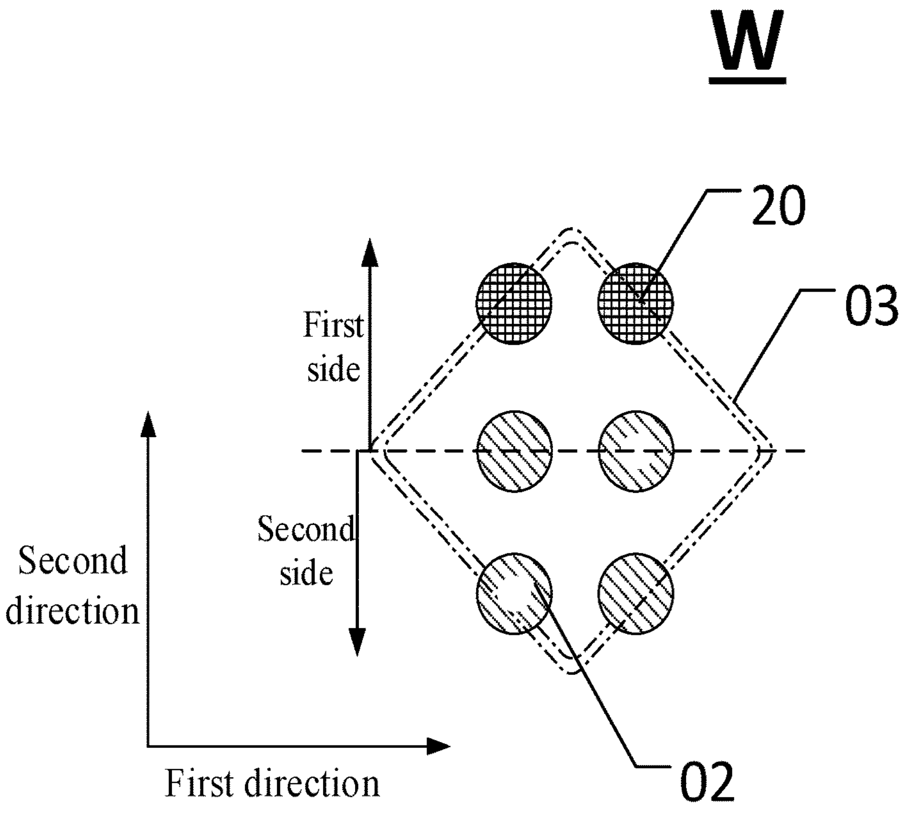
FIG. 3 illustrates a local zoom-in view of a region W of the display panel in FIG. 2 consistent with disclosed embodiments of the present disclosure.
Figure 4:
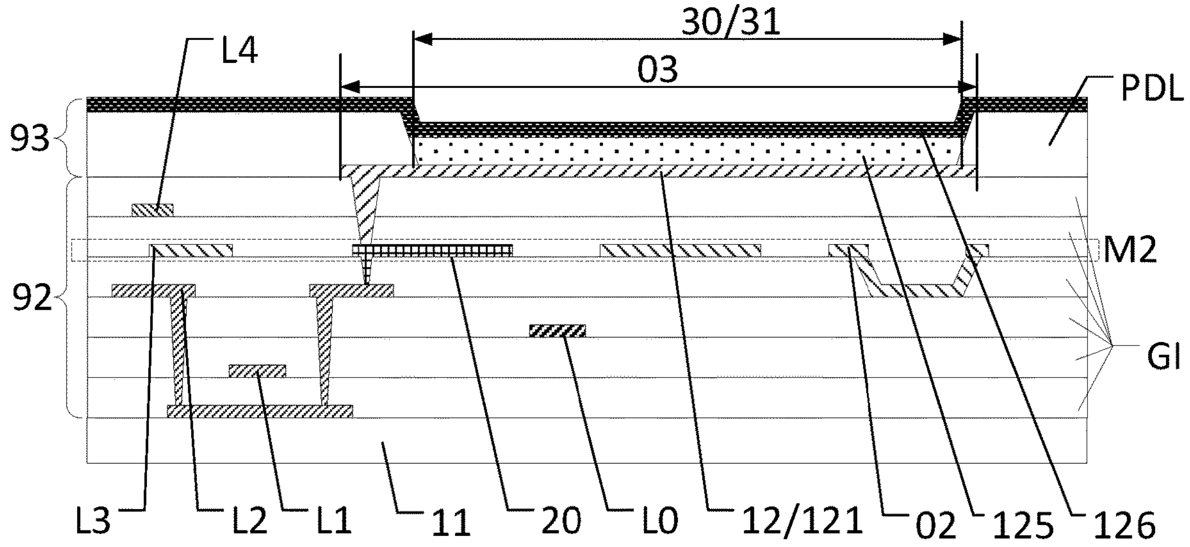
FIG. 4 illustrates an AA'-sectional view of the display panel in FIG. 2 consistent with disclosed embodiments of the present disclosure.

The present disclosure provides a display panel. FIG. 2 illustrates a top view of a display panel consistent with disclosed embodiments of the present disclosure; FIG. 3 illustrates a local zoom-in view of a region W of the display panel in FIG. 2; and FIG. 4 illustrates an AA'-sectional view of the display panel in FIG. 2. Referring to FIGS. 2-4, a display panel 100 may include a substrate 11, a plurality of anodes 12 disposed on a side of the substrate 11, and one or more reflection compensation structures 20. The plurality of anodes 12 may include a first anode 121. Along a direction perpendicular to the plane where the substrate 11 is located, the first anode 121 may overlap with a reflection compensation structure 20 of the one or more reflection compensation structures 20. The reflection compensation structure 20 may be disposed on a side of the first anode 121 facing towards the substrate 11.

The display panel 100 may include the substrate 11, and the plurality of anodes 12 disposed on the side of the substrate 11. The plurality of anodes 12 may at least include the first anode 121. The display panel 100 may also include the one or more reflection compensation structures 20. In one embodiment, along the direction perpendicular to the plane where the substrate 11 is located, the first anode 121 may overlap with the reflection compensation structure 20, and the reflection compensation structure 20 may be disposed on the side of the first anode 121 facing towards the substrate 11.

In one embodiment, referring to FIGS. 2-4, the reflection compensation structure 20 may be disposed in a region 03 corresponding to the first anode 121. The reflection compensation structure 20 may be disposed on the first side of the region 03 corresponding to the first anode 121. The reflection compensation structure 20 may be combined with the pads originally located in the display panel shown in FIG. 1, such that the reflection compensation structure 20 and the pad may be uniformly or symmetrically disposed as much as possible in the region 03 corresponding to the first anode 121. The addition of the reflection compensation structure 20 may be configured to perform reflection adjustment on the light irradiated on the surface of the first anode 121 away from the substrate 11 and emitted from the light-emitting surface of the display panel 100 towards the substrate 11. Therefore, in the region 03 where the first anode 121 is located, a portion of the side surface of the first anode 121 away from the substrate 11 and provided with the reflection compensation structure 20 and the pad may have a similar reflection effect on the incident light. The first anode 121 may have a substantially uniform reflection effect on the light incident on the first anode 121. The situation where the first side and the second side of the first anode 121 have a large difference in the reflection effect on light may be prevented. Therefore, the color shift problem existing in the display region corresponding to the first anode 121 may be reduced or even avoided, and the display uniformity of the display panel 100 may be improved.

It should be noted that FIGS. 2-4 may merely illustrate an exemplary schematic diagram where the display panel 100 includes the substrate 11, the anode 12, and the reflection compensation structure 20. In one embodiment, the display panel may include but may not be limited to such structures, and the display panel may also include any other structure, such as the film layer structures, pixel circuits, and driving circuits, etc. The pixel circuits and the driving circuits may often be disposed on the side of the anode facing towards the substrate.

In one embodiment, referring to FIG. 4, the display panel 100 may include the substrate 11, a first metal material layer L1, a capacitor metal layer L0, a second metal material layer L2, a third metal material layer L3, and a fourth metal material layer L4, etc., that are disposed over the side of the substrate 11 facing towards the anode 12. Adjacent metal material layers may be isolated by an insulating layer GI therebetween, to avoid crosstalk between electrical signals. In one embodiment, along a thickness direction of the display panel, the capacitive metal layer L0 may be disposed between the first metal layer L1 and the second metal layer L2, the third metal layer L3 may be disposed on the side of the second metal layer L2 facing towards the anode 12, and the fourth metal layer L4 may be disposed on the side of the third metal layer L3 facing towards the anode 12. When the display panel includes a transistor, in one embodiment, a gate of the transistor may be disposed on the first metal layer L1, and a source and a drain of the transistor may be disposed on the second metal layer L2. At least a portion of the metal of the capacitor metal layer L0 may overlap with a portion of the metal of the first metal layer L1 or the second metal layer L2, to form a capacitor structure, such as forming a storage capacitor of the pixel circuit in the display panel. In addition, the film layers of the first metal layer L1, the capacitor metal layer L0, the second metal layer L2, the third metal layer L3 and the fourth metal layer L4 may be used for wiring signal lines.

Further, the disclosed display panel may include a display panel using organic light-emitting diode (OLED) display technology, in other words, an OLED display panel. Referring to FIG. 4, the display panel may include the substrate 11, an array layer 92, and a light-exiting layer 93. In addition, the display panel may also include an encapsulation layer disposed on the side of the light-exiting layer 93 away from the substrate 11. The basic structure of the light-exiting layer 93 of the OLED display panel may include the anode 12, a light-emitting layer 125 and a cathode 126. The light-emitting layer 125 and the cathode 126 may be sequentially disposed over the side of the anode 12 away from the substrate 11.

When the power supplies an appropriate voltage, holes in the anode 12 and electrons in the cathode 126 may be combined in the light-emitting layer 125 to generate bright light. Compared with the thin film field effect transistor liquid crystal display, the OLED display device may have the characteristics of high visibility and high brightness, and may be more power-saving, lighter in weight, and thinner in thickness. In certain embodiments, the disclosed display panel may include a display panel using inorganic light-emitting diode display technology, such as a Micro LED display panel, or a Mini LED display panel, etc., which is not limited by the present disclosure.

It should be noted that the disposed reflection compensation structure 20 may be disposed in the third metal material layer L3 of the display panel 100. The reflection compensation structure may be configured to be electrically connected with any other structural component, and may be configured as a medium for electrical signal transmission. In another embodiment, the reflection compensation structure may not be electrically connected to any other structural component, and may merely function as a film layer structure. In addition, the reflection compensation structure 20 may include a planar plate structure according to requirements, or may include a concave structure that is recessed towards the substrate, or may include a block structure including a recessed-hole and overlapped with the through-hole on the side thereof facing towards the substrate.

No matter what structure the reflection compensation structure 20 includes, no matter whether the reflection compensation structure 20 is electrically connected to any other structural component, as long as the reflection compensation structure 20 disposed in the region 03 corresponding to the first anode 121 are capable of being combined with the pads originally disposed in the display panel shown in FIG. 1, and are uniformly or symmetrically disposed as much as possible in the region 03 corresponding to the first anode 121. When the reflection compensation structure and/or the pad are respectively disposed in the first side and the second side of the region 03 corresponding to the first anode 121, the disposure of the reflection compensation structure and the pad may make the surface of the anode 12 away from the substrate 11 in the corresponding region have the same or similar degree of concavity, or may make the surface of the anode 12 away from the substrate 11 in the corresponding region have the same or similar degree of convexity.

Therefore, depressions or protrusions may be uniformly or symmetrically disposed as much as possible in the first side and the second side of the region 03 corresponding to the surface of the anode 12 away from the substrate 11. In other words, the first side and the second side of the region 03 corresponding to the surface of the anode 12 away from the substrate 11 may have equivalent reflection degree and reflection direction of the light irradiated on the surface thereof.

The situation where one of the first side and the second side is provided with a depression or a protrusion while the other side has a planar structure, and the first side and the second side of the anode have obvious differences in the reflection degree and reflection direction of the light irradiated on the surface thereof may be prevented. Therefore, the uniformity of the light reflection of the anode 12 in the display panel may be improved, the color shift problem existing in the display region corresponding to certain anode 12 may be reduced or even avoided, and the display uniformity of the display panel 100 may be improved.

In one embodiment, the region 03 corresponding to the first anode 121 of the display panel 100 may be originally provided with pads biased towards the first side of the region. When the pads include the wire-changing pad 02 overlapped with the through-hole, the presence of the wire-changing pad 02 may cause the region corresponding to the first anode 121 away from the substrate 11 to have a problem of being recessed towards the substrate. In view of this, the reflection compensation structure 20 that is symmetrically disposed with respect to the wire-changing pad 02 may be provided in the region 03 biased towards the second side. The reflection compensation structure 20 may have a concave structure facing towards the substrate 11, or the reflection compensation structure 20 may have a block structure with a recessed hole on the side thereof facing towards the substrate 11. The corresponding region of the first anode 121 away from the substrate 11 in the corresponding region of the reflection compensation structure 20 may have the problem of being recessed towards the substrate 11.

In one embodiment, two reflection compensation structures 20 and four wire-changing pads 02 may be correspondingly disposed in the region 03. Both the reflection compensation structure 20 and the wire-changing pad 02 may have a concave structure towards the substrate 11, or may have a recessed-hole on the side thereof facing towards the substrate. Therefore, depressions may be uniformly or symmetrically disposed as much as possible in the first side and the second side of the region 03 corresponding to the surface of the first anode 121 away from the substrate 11, and then the first side and the second side of the first anode 121 may have almost same reflection effect on the light incident on the surface of the first anode 121 away from the substrate 11.

Similarly, in another embodiment, the region 03 corresponding to the first anode 121 of the display panel 100 may be originally provided with pads biased towards the first side of the region. The presence of the pad may cause the region corresponding to the first anode 121 to have a problem of being protruded away from the substrate 11. In view of this, the reflection compensation structure 20 that is symmetrically disposed with respect to the pad may be disposed in the region 03 biased towards the second side. The disposure of the reflection compensation structure 20 may cause the corresponding region of the first anode 121 to be protruded away from the substrate 11. Therefore, protrusions may be uniformly or symmetrically disposed as much as possible in the first side and the second side of the region 03 corresponding to the surface of the first anode 12 away from the substrate 11, and then the first side and the second side of the first anode 121 may have almost same reflection effect on the light incident on the surface of the first anode 121 away from the substrate 11.

It should be noted that FIG. 2 may merely illustrate the embodiment using a display panel with the shape of a rounded rectangle as an example. In certain embodiments, the display panel may have any other feasible shape, such as right-angled rectangle, circle, and ellipse, etc. FIG. 2 and FIG. 3 may merely illustrate the embodiment where the region 03 has a rectangle shape as an example. In certain embodiments, the region 03 may have any other feasible shape, such as circle, triangle, and hexagon, etc. FIG. 2 and FIG. 3 may merely illustrate the embodiment where the wire-changing pad and the reflection compensation structure 20 has a circle shape as an example. In certain embodiments, the wire-changing pad and the reflection compensation structure may have any other feasible shape, such as rectangle, triangle, and hexagon, etc.

It should be noted that in the cross-sectional view of FIG. 4, merely the planar reflection compensation structure 20 and the planar wire-changing pad may be illustrated to be disposed on the side of the anode 12 close to the substrate 11, while this is merely one of the ways of disposing the material layer near the first anode 121 in the region 03 where the first anode 121 is located. The structure of the reflection compensation structure 20 and the wire-changing pad in the region 03 where the first anode 121 is located may not be limited by the present disclosure, and the specific structure of the reflection compensation structure 20 and the wire-changing pad in the region 03 where the first anode 121 is located may be determined according to the requirements.

Referring to FIGS. 2-4, in one embodiment, the display panel may further include a plurality of pixel opening regions 30. The plurality of pixel opening regions 30 may include a first pixel opening region 31. Along the direction perpendicular to the plane where the substrate 11 is located, the reflection compensation structure 20 may overlap with the first pixel opening region 31.

In one embodiment, the display panel may further include the plurality of pixel opening regions 30. The plurality of pixel opening regions 30 may include the first pixel opening region 31. Along the direction perpendicular to the plane where the substrate 11 is located, the reflection compensation structure 20 may overlap with the first pixel opening region 31. A light-emitting component may be disposed in the pixel opening region 30. The light-emitting component may include the cathode 126, the light-emitting layer 125, and the anode 12 that are sequentially stacked. In other words, the anode 12 may be disposed in the pixel opening region 30. The reflection compensation structure 20 may be disposed in the first pixel opening region 31. When the first pixel opening region 31 is provided with the pad, the reflection compensation structures 20 and the pad in the pixel opening region 30 may be uniformly or symmetrically disposed as much as possible in the region 03 corresponding to the first anode 121 in the pixel opening region 30.

The reflection compensation structure 20 and the pad together may be configured to adjust the concave or convex degree of the surface of the first anode 121 away from the substrate 11 in the corresponding region, and then may be configured to perform the reflection adjustment on the light irradiated on the surface of the first anode 121 and emitted from the light-exiting side of the display panel 100 towards the substrate 11. Therefore, the portion of the first anode 121 in the first pixel opening region 31 that are correspondingly provided with the reflection compensation structure 20 and the pad may have equivalent reflection effect on the incident light. The first anode 121 in the first pixel opening region 31 may have a substantially uniform reflection effect on the incident light, and the situation where at least two portions of the first anode 121 in the first pixel opening region 31 have obvious differences in the reflection effect on the incident light may be prevented. Therefore, the color shift problem existing in the display region corresponding to the first pixel opening region 31 may be reduced or even avoided, and the display uniformity of the display panel 100 may be improved.

Figure 5:
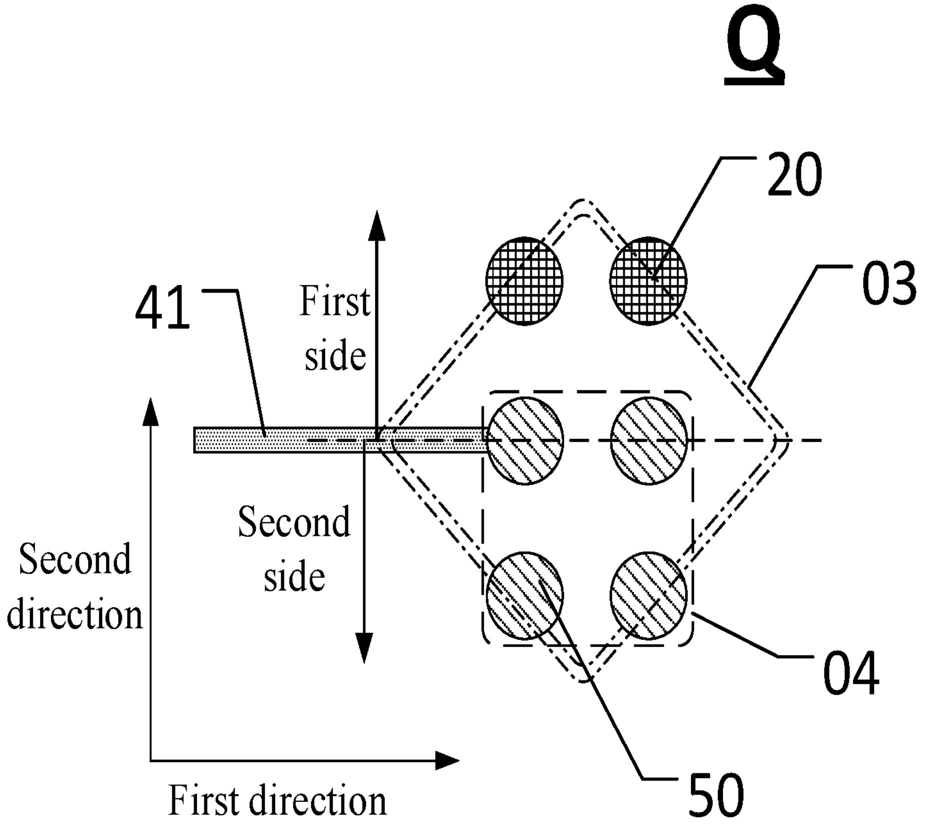
FIG. 5 illustrates a local zoom-in view of a region Q of the display panel in FIG. 2 consistent with disclosed embodiments of the present disclosure.

FIG. 5 illustrates a local zoom-in view of a region Q of the display panel in FIG. 2 consistent with disclosed embodiments of the present disclosure. In one embodiment, referring to FIGS. 2-5, the display panel may further include a first signal trace 41 extended along a first direction and a second signal trace 42 extended along a second direction, where the first direction may intersect the second direction. Along the direction perpendicular to the plane where the substrate 11 is located, the first signal trace 41 may overlap with the first anode 121, and may be located on the side of the first anode 121 facing towards the substrate 11. Along the second direction, the reflection compensation structure 20 may at least be located on a first side of the first signal trace 41.

In one embodiment, the display panel 100 may further include the first signal trace 41 and the second signal trace 42. The first signal trace 41 may be extended along the first direction, and the second signal trace 42 may be extended along the second direction intersecting with the first direction. In one embodiment, the first direction and the second direction may be perpendicular to each other. In view of this, in the direction perpendicular to the plane where the substrate 11 is located, the first signal trace 41 may overlap with the first anode 121, and the first signal trace 41 may be disposed on the side of the first anode 121 facing towards the substrate 11. Along the second direction, the added reflection compensation structure 20 in the display panel 100 may be located on the first side of the first signal trace 41.

In one embodiment, referring to FIG. 5, a pad unit group 04 may include four pads arranged in a rectangular shape. In the region 03 where the first anode 121 is located, a first side region and a second side region may be oppositely disposed in the second direction. Two pads may be located between the first side region and the second side region of the first anode 121, and the other two pads may be located in the second side region of the first anode 121. One pad of the two pads that are located between the first side region and the second side region may be electrically connected to the first signal trace 41. In view of this, the added reflection compensation structure 20 in the display panel 100 may be located at least in the first side region of the first anode 121 along the second direction. Therefore, in the region 03 corresponding to the first anode 121, along the second direction, two pads may be disposed between the first side region and the second side region, two pads may be disposed in the second side region, and two reflection compensation structures 20 may be disposed in the first side region. Along the second direction and/or along the first direction, the pads and the reflection compensation structures 20 may be symmetrically disposed in the region 03 corresponding to the first anode 121. The reflection compensation structure 20 and the pad together may adjust the concave or convex degree of the surface of the first anode 121 away from the substrate 11 in the corresponding region. Therefore, the portions of the region 03 corresponding to the first anode 121 that are correspondingly provided with the reflection compensation structure 20 and the pad may have equivalent reflection effect on the incident light. The surface of the first anode 121 away from the substrate 11 in the region 03 may have a substantially uniform reflection effect on the incident light, and the situation where the first side and the second side of the surface of the first anode 121 away from the substrate have obvious differences in the reflection effect on the incident light may be prevented. Therefore, the color shift problem existing in the display region corresponding to the first anode 121 may be reduced or even avoided, and the display uniformity of the display panel 100 may be improved.

In one embodiment, when the four pads in the pad unit group 04 shown in FIG. 5 include a concave structure towards the substrate 11, the added two reflection compensation structures 20 may also have the concave structure towards the substrate 11. Therefore, the reflection compensation structure 20 and the pad unit group 04 may together adjust the concave degree of the surface of the first anode 121 away from the substrate 11 in the corresponding region. The portions of the region 03 corresponding to the first anode 121 that are correspondingly provided with the reflection compensation structure 20 and the pad unit group 04 may have equivalent reflection effect on the incident light, such that the surface of the first anode 121 away from the substrate 11 may have a substantially uniform reflection effect on the incident light.

Figure 6:
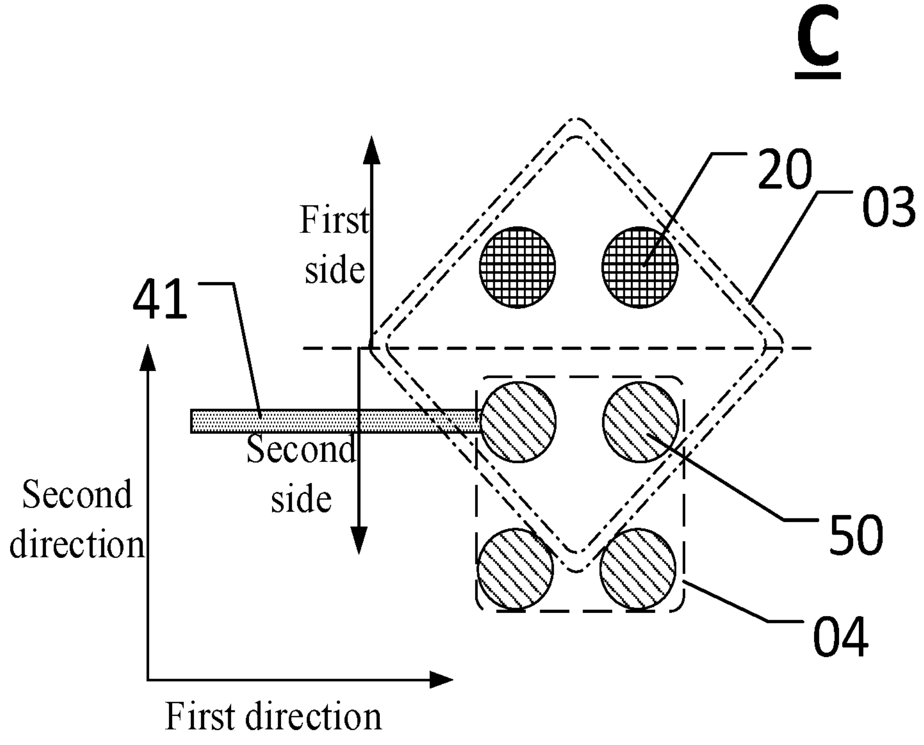
FIG. 6 illustrates a local zoom-in view of a region C of the display panel in FIG. 2 consistent with disclosed embodiments of the present disclosure.

FIG. 6 illustrates a local zoom-in view of a region C of the display panel in FIG. 2 consistent with disclosed embodiments of the present disclosure. Referring to FIG. 2, FIG. 4 and FIG. 6, in one embodiment, as shown in the region C, one pad unit group 04 may include four pads arranged in a rectangular shape, and the first anode 121 may include the first side region and the second side region that are oppositely arranged in the second direction. Two pads may be located in the second side region of the first anode 121. The other two pads may be located outside the region 03 where the first anode 121 is located, in other words, may be located on the side of the second side region of the first anode 121 far away from the first side region. One pad of the two pads located in the second side region may be electrically connected to the first signal trace 41. In view of this, the added reflection compensation structure 20 in the display panel 100 may be disposed at least in the first side region of the first anode 121 along the second direction. In view of such arrangement, in the region 03 corresponding to the first anode 121, along the second direction, two pads may be disposed in the second side region, and two reflection compensation structures 20 may be disposed in the first side region. Along the second direction and/or along the first direction, the pads and the reflection compensation structures 20 may be symmetrically disposed in the region 03 corresponding to the first anode 121. The reflection compensation structure 20 and the pad together may adjust the concave or convex degree of the surface of the first anode 121 away from the substrate 11 in the corresponding region. Therefore, the portions of the region 03 corresponding to the first anode 121 that are correspondingly provided with the reflection compensation structure 20 and the pad may have equivalent reflection effect on the incident light. The surface of the first anode 121 away from the substrate 11 in the region 03 may have a substantially uniform reflection effect on the incident light, and the situation where the first side and the second side of the first anode 121 have obvious differences in the reflection effect on the incident light may be prevented. Therefore, the color shift problem existing in the display region corresponding to the first anode 121 may be reduced or even avoided, and the display uniformity of the display panel 100 may be improved.

Referring to FIGS. 2-6, in one embodiment, the display panel may further include a conductive pad 50. Along the direction perpendicular to the plane where the substrate 11 is located, the conductive pad 50 may overlap with the first anode 121, and may be disposed on the side of the first anode 121 facing towards the substrate 11.

In one embodiment, at least one conductive pad 50 may be located on the second side of the first signal trace 41 along the second direction. The first side of the first signal trace 41 may be opposite to the second side of the first signal trace 41.

In another embodiment, at least one conductive pad 50 may overlap with the first signal trace 41 in the direction perpendicular to the plane of the substrate 11. The conductive pad may be understood as the wire-changing pad 02.

In the existing display panel, the wire-changing pad 02 is disposed in the region 01 corresponding to the anode. The wire-changing pads 02 may not be substantially uniformly disposed in the region 01 corresponding to the anode, and the number of wire-changing pads 02 in the region 01 corresponding to the anode may not be determined. For example, referring to FIG. 1, if merely the α2 wire-changing pad 02 and the α3 wire-changing pad 02 are disposed in the region 01, the region 01 may merely be provided with the wire-changing pad 02 located in the middle region between the first side and the second side and biased to the left, and the wire-changing pad 02 located in the second side and biased to the right. Then, the wire-changing pads 02 may not be uniformly or symmetrically disposed in the region 01. Therefore, a portion of the surface of the anode 12 away from the substrate 11 in the corresponding region 01 where the α2 wire-changing pad 02 and the α3 wire-changing pad 02 are disposed may have a reflection effect different from the other portion of the surface of the anode 12 away from the substrate 11 without disposing the wire-changing pad 02. Different regions of the surface of the anode 12 away from the substrate 11 in the corresponding region 01 may have different reflection effect on the incident light, which will cause the region 01 of the corresponding display panel to present different display images, and lead to inconsistent display of the display panel. In addition, there may also be a situation where the wire-changing pad 02 is not disposed in the region 01.

Therefore, the region 01 in the display panel may have following configuration situations. One includes that a portion of the regions 01 is provided with the wire-changing pads 02 arranged in a substantially symmetrical or uniform arrangement. Second includes that another portion of the region 01 is provided with the wire-changing pad 02, while the wire-changing pads 02 are asymmetrically or non-uniformly arranged in the region 01. Third includes that the other portion of the region 01 is not provided with the wire-changing pad 02. Because the arrangement conditions of the corresponding wire-changing pads 02 in different regions 01 are different, the surfaces of the anodes 12 away from the substrate 11 corresponding to the multiple regions 01 may have different reflection effects on incident light, which leads to non-uniform display of the display panel.

Therefore, for the situation where the wire-changing pads 02 are arranged in disorder in certain region 01, or the wire-changing pads 02 are not disposed in the other regions 01, in one embodiment, the display panel 100 may include the conductive pad 50. Along the direction perpendicular to the plane where the substrate 11 is located, the conductive pad 50 may overlap with the first anode 121, and at the same time, the conductive pad 50 may be disposed on the side of the first anode 121 facing towards the substrate 11. In other words, the conductive pad 50 and the reflection compensation structure 20 may be disposed in the region 03 corresponding to the first anode 121.

Referring to FIG. 5 and FIG. 6, when the conductive pad 50 and the reflection compensation structure 20 are simultaneously provided in the region 03, the conductive pad 50 and the reflection compensation structure 20 may be systemically or uniformly arranged as much as possible in the region 03. By adjusting the structure of the conductive pad 50 and the reflection compensation structure 20, in other words, by determining whether the conductive pad 50 and the reflection compensation structure 20 include a concave structure that is recessed towards the substrate 11, or whether the conductive pad 50 and the reflection compensation structure 20 include any other structure that is capable of causing the conductive pad 50 and reflection compensation structure 20 to be recessed toward the substrate 11, the conductive pad 50 and the reflection compensation structure 20 may be combined to make the surface of the correspondingly provided surface of the first anode 121 away from the substrate 11 have the same degree of slight protrusion or slight depression. Therefore, the surfaces of the plurality of first anodes 121 away from the substrate 11 may have the same reflection effect on incident light.

It should be noted that the display panel 100 may include the conductive pad 50, and the conductive pad 50 may be electrically connected with certain signal trace, to realize the transmission of the corresponding electrical signal required for the operation of the display panel 100. In another embodiment, certain pad 50 may not be electrically connected with any trace or structural component.

In one embodiment, referring to FIG. 5, the display panel 100 may include the first signal trace 41 extended along the first direction. The conductive pad 50 in the region 03 corresponding to the first anode 121 may overlap with the first signal trace 41 along the direction perpendicular to the plane where the substrate 11 is located, and may be electrically connected to the first signal trace 41. At the same time, the second side of the region 03 corresponding to the first anode 121 in the second direction may be provided with the conductive pad 50. The two conductive pads 50 in the second side region may be disposed on the second side region of the first signal trace 41, and along the second direction, the reflection compensation structure 20 may be disposed in the first side region of the first signal trace 41.

Therefore, in the region 03 corresponding to the first anode 121, the four conductive pads 50 and the two reflection compensation structures 20 may be symmetrically arranged in the region corresponding to the first anode 121 along the second direction or along the first direction. Through the disposure of the reflection compensation structure 20 and the conductive pad 50 in the region 03 corresponding to the first anode 121 and further adjustment of the structure thereof, the surface of the first anode 121 away from the substrate 11 may have substantially uniformly or symmetrically disposed slight protrusions or slight depressions. Therefore, the surface of the first anode 121 away from the substrate 11 may have a substantially uniform reflection effect on incident light. The situation where the first side and the second side of the first anode 121 have obvious differences in the reflection effect on the incident light may be prevented. Therefore, the color shift problem existing in the display region corresponding to the first anode 121 may be reduced or even avoided, and the display uniformity of the display panel 100 may be improved.

In addition, referring to FIG. 5, when the region 03 includes six circular structures, any one of the six circular structures may refer to at least one of the conductive pad 50 and the reflection compensation structure 20. As long as the conductive pads 50 and/or the reflection compensation structures 20 in the region 03 are symmetrically or uniformly distributed as much as possible in such region, the surface of the first anode 121 away from the substrate 11 may have substantially uniformly or symmetrically disposed slight protrusions or slight depressions. Therefore, the surface of the first anode 121 away from the substrate 11 may have a substantially uniform reflection effect on incident light.

In another embodiment, referring to FIG. 6, the display panel 100 may include the first signal trace 41 extended along the first direction. The conductive pad 50 in the region 03 corresponding to the first anode 121 may overlap with the first signal trace 41 along the direction perpendicular to the plane where the substrate 11 is located, and may be electrically connected to the first signal trace 41. At the same time, the conductive pad 50 electrically connected to the first signal trace 41 may be located in the second side region of the region 03 corresponding to the first anode 121. Along the second direction, the reflection compensation structure 20 may be at least disposed in the first side region of the first anode 121. Therefore, in the region 03 corresponding to the first anode 121, the two conductive pads 50 and the two reflection compensation structures 20 may be symmetrically arranged in the region corresponding to the first anode 121 along the second direction or along the first direction. Through the disposure of the reflection compensation structure 20 and the conductive pad 50 in the region 03 corresponding to the first anode 121, the surface of the first anode 121 away from the substrate 11 may have substantially uniformly or symmetrically disposed slight protrusions or slight depressions. Therefore, the surface of the first anode

121 away from the substrate 11 may have a substantially uniform reflection effect on incident light. The situation where the first side and the second side of the first anode 121 have obvious differences in the reflection effect on the incident light may be prevented. Therefore, the color shift problem existing in the display region corresponding to the first anode 121 may be reduced or even avoided, and the display uniformity of the display panel 100 may be improved.

In addition, referring to FIG. 6, when the region 03 includes four circular structures, any one of the four circular structures may refer to at least one of the conductive pad 50 and the reflection compensation structure 20. As long as the conductive pads 50 and/or the reflection compensation structures 20 in the region 03 are symmetrically or uniformly distributed as much as possible in such region, the surface of the first anode 121 away from the substrate 11 may have substantially uniformly or symmetrically disposed slight protrusions or slight depressions. Therefore, the surface of the first anode 121 away from the substrate 11 may have a substantially uniform reflection effect on incident light.

It should be noted that FIG. 5 and FIG. 6 may merely be used to illustrate two situations of the arrangement positions of the reflection compensation structure 20 and the conductive pad 50, and may not be used to illustrate the specific arrangement structure, shape, size, and quantity of the reflection compensation structures 20 and the conductive pads 50.

Figure 7:
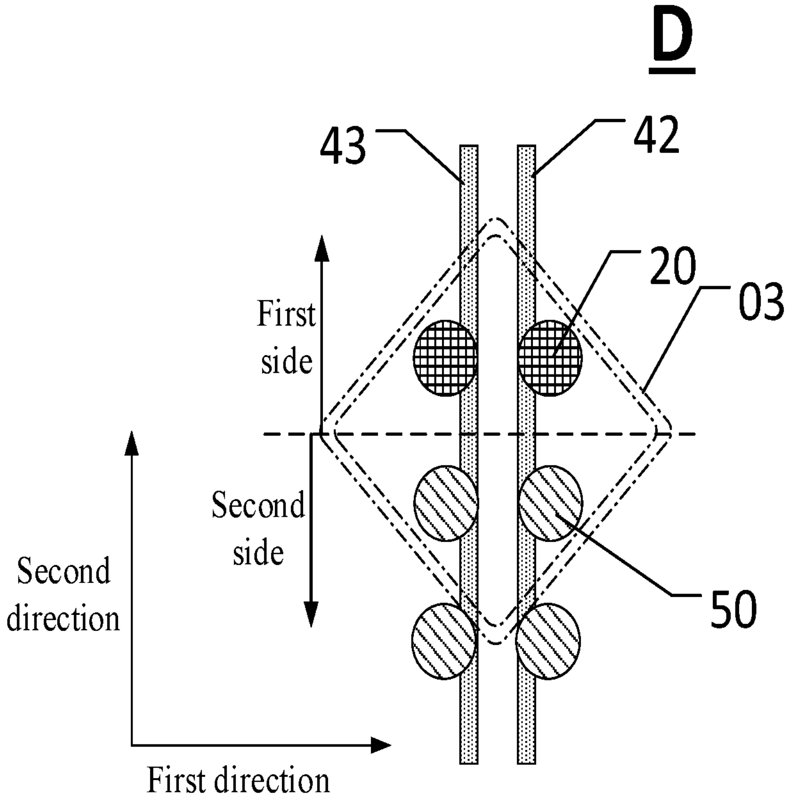
FIG. 7 illustrates a local zoom-in view of a region D of the display panel in FIG. 2 consistent with disclosed embodiments of the present disclosure.
Figure 8:
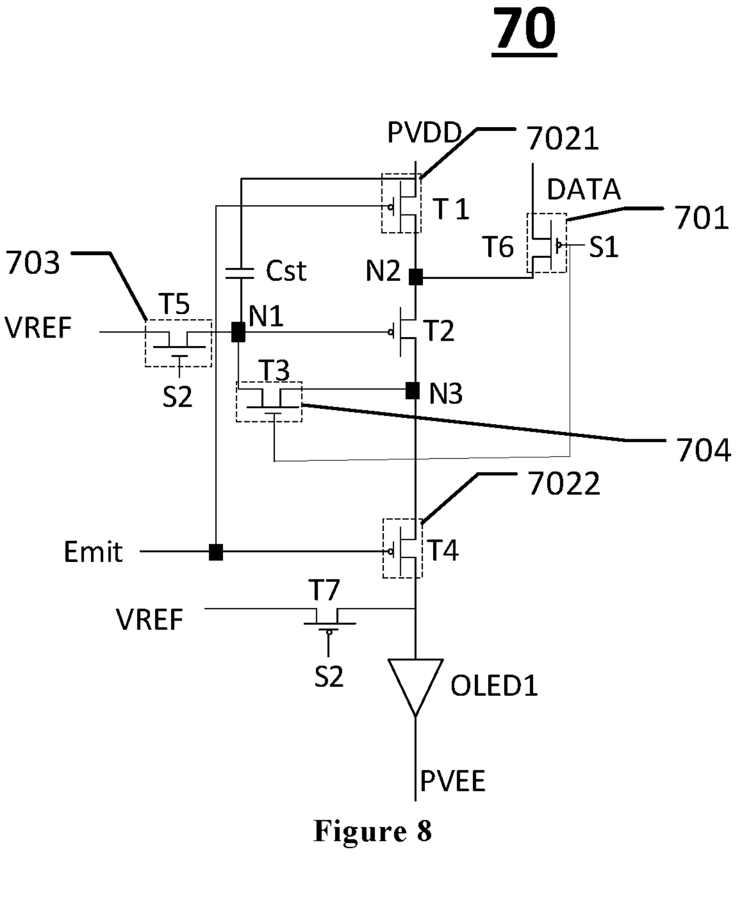
FIG. 8 illustrates a schematic diagram of a pixel circuit of an exemplary display panel consistent with disclosed embodiments of the present disclosure.

FIG. 7 illustrates a local zoom-in view of a region D of the display panel in FIG. 2 consistent with disclosed embodiments of the present disclosure; and FIG. 8 illustrates a schematic diagram of a pixel circuit of a display panel consistent with disclosed embodiments of the present disclosure. Referring to FIG. 2, FIG. 4 and FIG. 7, in one embodiment, the display panel may further include a third signal trace 43. The third signal trace 43 and the second signal trace 42 may be extended in a same direction and disposed on a same layer. The conductive pad 50 may be electrically connected to the second signal trace 42 or the third signal trace 43.

Further, the display panel 100 may include the third signal trace 43, and both the third signal trace 43 and the second signal trace 42 may be extended along the second direction. The third signal trace 43 may be disposed on the same layer as the second signal trace 42. For the conductive pads 50 included in the display panel 100, certain conductive pad 50 may be electrically connected to the second signal trace 42, or certain conductive pad 50 may be electrically connected to the third signal trace 43.

It should be noted that the display panel 100 may include a pixel circuit. The pixel circuit may be configured to be electrically connected with the sub-pixel in the display panel, and the electrical signal received through the pixel circuit may realize the control of whether the corresponding sub-pixel is in the display state. Referring to FIG. 8, the pixel circuit 70 may include a data writing module 701, a first light-emitting control module 7021, a second light-emitting control module 7022, a reset module 703, and a compensation module 704. The specific working principle of the pixel circuit 70 may include following. In an initialization stage, a transistor T5 may be turned on, and a transistor T7 may be turned off. A voltage of the first initialization signal terminal VREF may be transmitted to a first node N1 through the transistor T5, to initialize a driving transistor T2. In a data-writing stage, both the transistor T5 and the transistor T7 may be turned off, a transistor T3 and a transistor T6 may be turned on, and a data signal terminal DATA may receive a data signal transmitted through a data signal line and may transmit the data signal to the second node N2. The signal of the second node N2 may be transmitted to a third node N3 through the driving transistor T2, and the signal of the third node N3 may be transmitted to the first node N1 through the transistor T3, such that the potential of the first node N1 may increase. In a light-emitting stage, the transistor T3 and the transistor T6 may be turned off, the transistor T1 and the transistor T4 may be turned on, and the driving current generated by the driving transistor T2 may be transmitted to the light-emitting component OLED1, such that the light-emitting component OLED1 may emit light. It should be noted that FIG. 8 may merely illustrate a circuit structure with a 7T1C mode of the pixel circuit 70, while the present disclosure may not be limited thereto. The specific circuit structure of the pixel circuit may be adaptively adjusted according to requirements. Moreover, the pixel circuit may be embodied as 8T1C, 9T2C, etc., which may not be limited by the present disclosure.

In one embodiment, the second signal trace 42 may include the data signal line in the display panel 100. Referring to FIG. 8, the second signal trace 42 may be electrically connected to a first electrode of the transistor T6 in the data-writing module 701 of the pixel circuit 70, in other words, may be connected to the DATA terminal in FIG. 8. In one embodiment, in the film layer structure of the display panel 100, the conductive pad 50 may be electrically connected to the second signal trace 42, and the conductive pad 50 may be configured to transmit the electrical signal transmitted by the data signal trace to the corresponding pixel unit.

In one embodiment, the third signal trace 43 may include a PVEE signal line (power supply voltage signal line). Referring to FIG. 7, the first conductive pad 50 disposed on a first position from left to right along the first direction and on a first position from top to bottom along the second direction may be electrically connected to the third signal trace 43. In other words, the perspective view may illustrate that the third signal trace 43 is connected to the conductive pad 50. When the third signal trace 43 and the conductive pad 50 are arranged in different layers, the electrical connection between the third signal trace 43 and the conductive pad 50 may be realized by a via, which may be equivalent to connecting the third signal trace 43 with a signal in parallel, and may facilitate to reduce the overall impedance of the third signal trace 43 and to reduce the load. In addition, in another embodiment, when the third signal trace 43 and the conductive pad 50 are arranged on the same layer, the third signal trace 43 may be directly electrically connected to the conductive pad 50, which may be equivalent to increasing the area of the third signal trace 43, and may facilitate to reduce the impedance and to reduce the load.

It should be noted that in addition to being used as the PVEE signal line, the third signal trace 43 may be configured as an auxiliary signal line for transmitting an electrical signal to the data signal line, such as a FIAA trace extended along the second direction. In another embodiment, a partial segment of the third signal line 43 may be configured as the PVEE signal line, and another partial segment of the third signal line 43 may be configured as an auxiliary signal line for transmitting the electrical signal to the data signal line, which may not be limited by the present disclosure, and the specific function of the third signal trace 43 in the display panel may be determined according to practical applications.

It should be noted that the conductive pad 50 included in the display panel 100 may be configured to be electrically connected with the data signal line, to be electrically connected with the power supply voltage signal line, and to be electrically connected with the FIAA trace, etc., which may merely be examples and may not be limited by the present disclosure. The signal lines electrically connected to the conductive pads 50 may be determined according to practical applications. A portion of the conductive pads 50 may be floated, and may not be electrically connected to any signal line.

Referring to FIG. 2, FIG. 4 and FIG. 7, in one embodiment, the reflection compensation structure 20 may be electrically connected to the second signal trace 42 or the third signal trace 43.

In one embodiment, when the reflection compensation structure 20 is provided in the display panel 100, the second signal trace 42 may include the data signal line in the display panel 100. When required by the design of the display panel, the reflection compensation structure 20 may be multiplexed as the conductive pad. Referring to FIG. 7, the reflection compensation structure 20 disposed on a second position from left to right along the first direction may be electrically connected to the second signal trace 42. In other words, the perspective view may illustrate that the second signal trace 42 is connected to the reflection compensation structure 20. The reflection compensation structure 20 may be electrically connected to the second signal trace 42, and reflection compensation structure 20 may be configured to transmit the electrical signal transmitted by the data signal trace to the corresponding pixel unit.

In another embodiment, referring to FIG. 7, the third signal trace 43 may include the PVEE signal line (power supply voltage signal line). The reflection compensation structure 20 may be electrically connected to the third signal trace 43. When the third signal trace 43 and the reflection compensation structure 20 are arranged in different layers, the electrical connection between the third signal trace 43 and the reflection compensation structure 20 may be realized by a via, which may be equivalent to connecting the third signal trace 43 with a signal in parallel, and may facilitate to reduce the overall impedance of the third signal trace 43 and to reduce the load. In addition, in another embodiment, when the third signal trace 43 and the reflection compensation structure 20 are arranged on the same layer, the third signal trace 43 may be directly electrically connected to the reflection compensation structure 20, which may be equivalent to increasing the area of the third signal trace 43, and may facilitate to reduce the impedance and to reduce the load.

It should be noted that in addition to being used as the PVEE signal line, the third signal trace 43 may be configured as an auxiliary signal line for transmitting an electrical signal to the data signal line, such as a FIAA trace extended along the second direction. In another embodiment, a partial segment of the third signal line 43 may be configured as the PVEE signal line, and another partial segment of the third signal line 43 may be configured as an auxiliary signal line for transmitting the electrical signal to the data signal line, which may not be limited by the present disclosure, and the specific function of the third signal trace 43 in the display panel may be determined according to practical applications.

It should be noted that the reflection compensation structure 20 included in the display panel 100 may be configured to be electrically connected with the data signal line, to be electrically connected with the power supply voltage signal line, and to be electrically connected with the FIAA trace, etc., which may merely be examples and may not be limited by the present disclosure. The signal lines electrically connected to the reflection compensation structure 20 may be determined according to practical applications. A portion of the reflection compensation structures 20 may be floated, and may not be electrically connected to any signal line.

Figure 9:
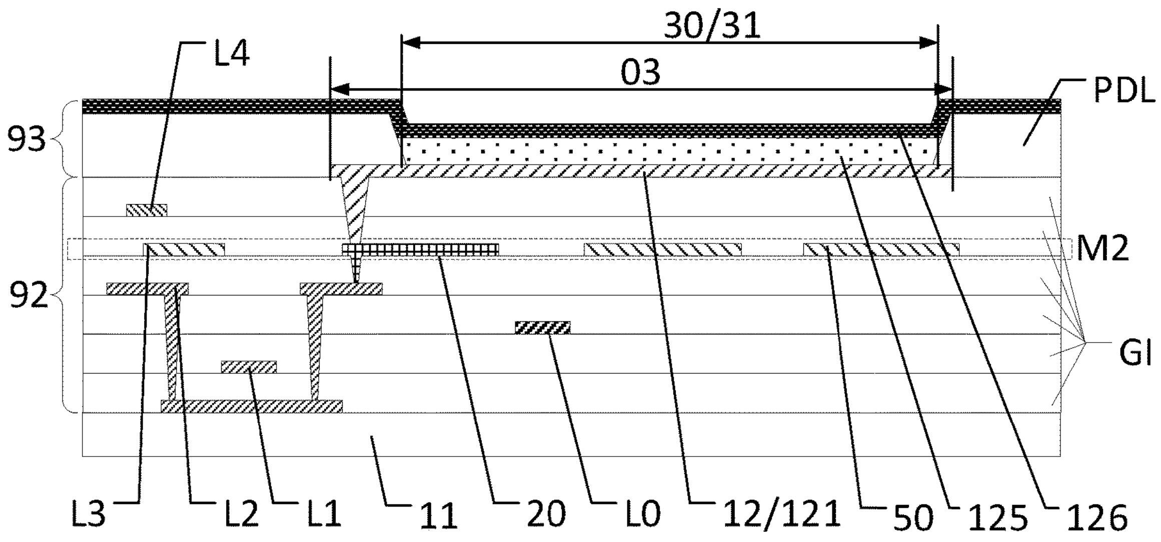
FIG. 9 illustrates a VV'-sectional view of the display panel in FIG. 2 consistent with disclosed embodiments of the present disclosure.

FIG. 9 illustrates a VV'-sectional view of the display panel in FIG. 2 consistent with disclosed embodiments of the present disclosure. Referring to FIG. 2 and FIG. 9, in one embodiment, the reflection compensation structure 20 may be disposed on the same layer as the conductive pad 50.

In one embodiment, when the display panel 100 simultaneously includes the conductive pad 50 and the reflection compensation structure 20, the reflection compensation structure 20 and the conductive pad 50 may be disposed on the same layer and formed in a same process, to avoid the increase of the overall thickness of the display panel 100 caused by the fabrication of the reflection compensation structure 20 and the conductive pad 50 in different layers, and to simplify the fabrication process of the display panel 100.

The embodiment where the reflection compensation structure 20 and the conductive pad 50 are disposed on the same layer and formed in the same process may merely be an example, which may not be limited by the present disclosure. The disposure manner of the reflection compensation structure 20 and the conductive pad 50 in the display panel 100 may be determined according to practical applications.

Figure 10:
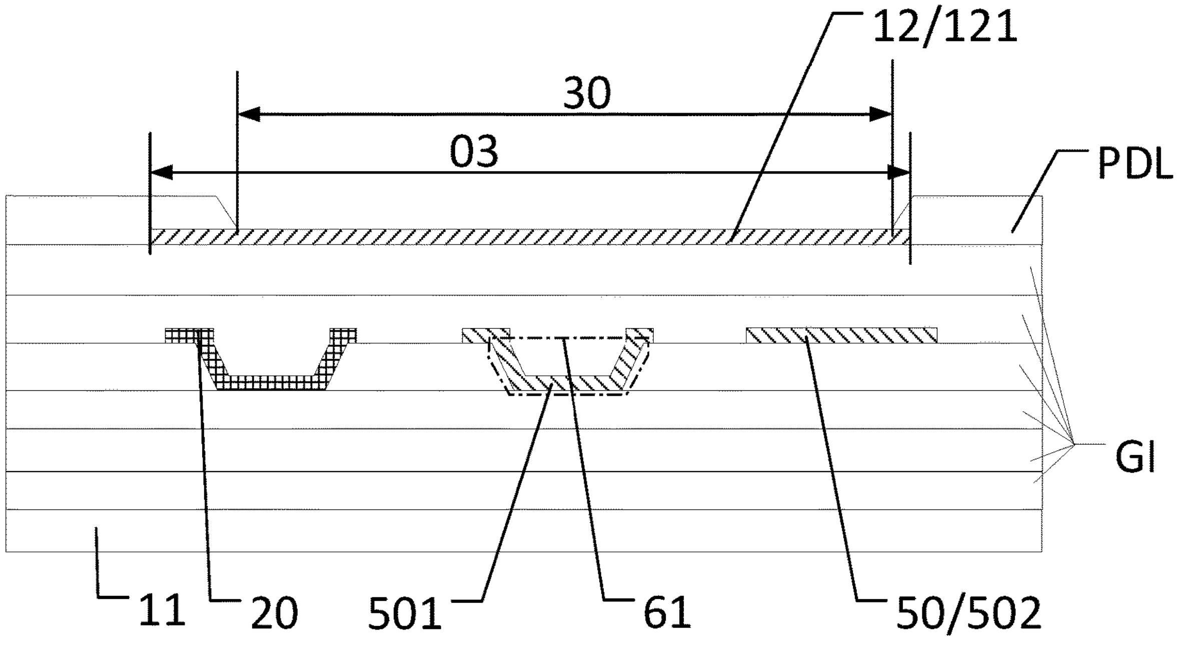
FIG. 10 illustrates another VV'-sectional view of the display panel in FIG. 2 consistent with disclosed embodiments of the present disclosure.
Figure 11:
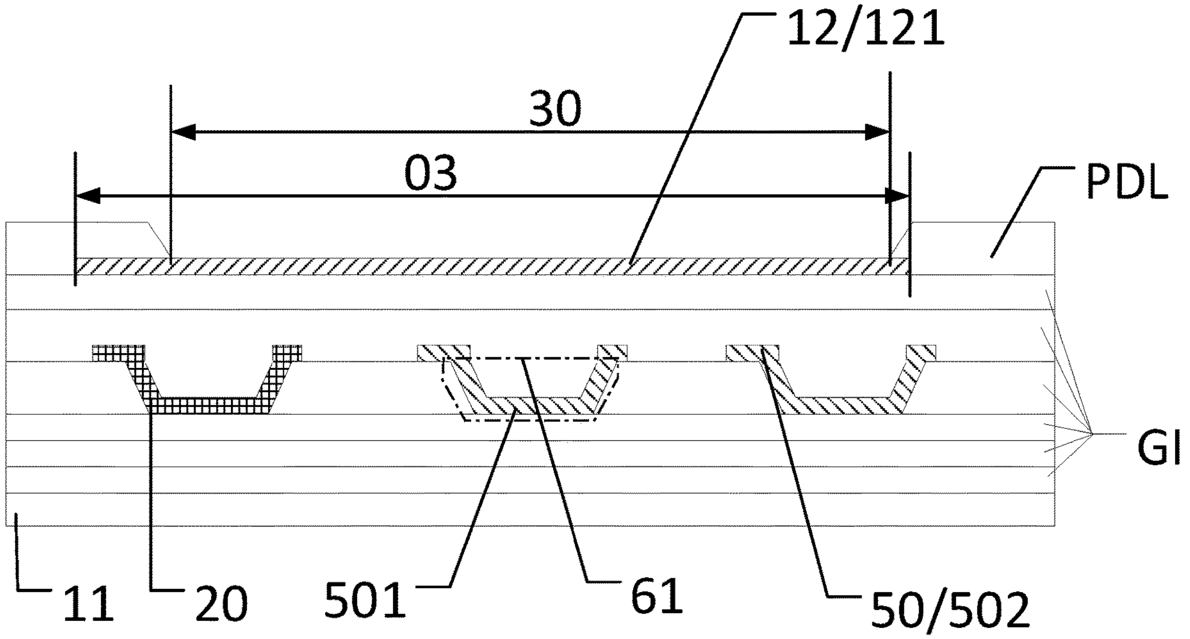
FIG. 11 illustrates another VV'-sectional view of the display panel in FIG. 2 consistent with disclosed embodiments of the present disclosure.

FIG. 10 illustrates another VV'-sectional view of the display panel in FIG. 2 consistent with disclosed embodiments of the present disclosure; and FIG. 11 illustrates another VV'-sectional view of the display panel in FIG. 2 consistent with disclosed embodiments of the present disclosure. Referring to FIG. 2, FIG. 10 and FIG. 11, in one embodiment, the display panel may further include a first through-hole 61. The conductive pads 50 may include a first conductive pad 501 and a second conductive pad 502. The first through-hole 61 may be in contact with the first conductive pad 501, and may be disposed on the side of the first conductive pad 501 facing towards the substrate 11.

In one embodiment, the conductive pads 50 included in the display panel 100 may include the first conductive pad 501 and the second conductive pad 502. In one embodiment, the display panel 100 may further include the first through-hole 61. At least one insulating layer GI on the side of the first conductive pad 501 facing towards the substrate 11 may be partially recessed towards the substrate 11 to from the first through-hole 61. When the first conductive pad 501 needs to be electrically connected to a signal trace, the signal trace may be disposed in a certain insulating film layer on the side of the first conductive pad 501 facing towards the substrate 11. The recessed bottom of the first through-hole 61 facing towards the substrate 11 may be in contact with the surface of the corresponding signal trace away from the substrate 11, such that when the first conductive pad 501 is formed on the surface of the first through-hole 61 away from the substrate 11, the first conductive pad 501 may be formed on the side and the recessed bottom of the insulating layer GI corresponding to the first through-hole 61, to realize the electrical connection between the first conductive pad 501 and the corresponding signal trace.

Moreover, when the conductive pad 50 and the reflection compensation structure 20 are correspondingly disposed in the region 03 where the first anode 121 is located, because the conductive pad 50 and/or the reflection compensation structure 20 are electrically connected to the signal traces arranged in different layers, the conductive pad 50 and/or the reflection compensation structure 20 may include a concave structure that is recessed towards the substrate 11. The surface of the first anode 121 away from the substrate 11 in the region corresponding to the conductive pad 50 and/or the reflection compensation structure 20 including the concave structure may have a reflection effect on the incident light different from the surface of the first anode 121 away from the substrate 11 in the region corresponding to the conductive pad 50 and/or the reflection compensation structure 20 including a planar structure.

Therefore, referring to FIG. 11, all the conductive pads 50 and/or all the reflection compensation structures 20 disposed in the region 03 corresponding to the first anode 121 may have a concave structure recessed towards the substrate 11. The surface of the first anode 121 away from the substrate 11 in the region corresponding to all the conductive pads 50 and all the reflection compensation structures 20 in the region 03 where the first anode 121 is located may have the same reflection effect on the incident light. The surface of the first anode 121 away from the substrate 11 may have a substantially uniform reflection effect on the incident light, and the situation where different regions of the surface of the first anode 121 away from the substrate 11 may have obvious differences in the reflection effect on the incident light may be prevented. Therefore, the color shift problem existing in the display region corresponding to the first anode 121 may be reduced or even avoided, and the display uniformity of the display panel 100 may be improved.

It should be noted that FIG. 10 and FIG. 11 may merely illustrate the substrate 11, the first anode 121, the conductive pad 50 and the reflection compensation structure 20 included in the film layer structures of the display panel. The other unmarked film layer structures on the side of the first anode 121 facing towards the substrate 11 may include certain insulating layers GI. The structural components such as transistors and capacitors that may be included between the first anode 121 and the substrate 11 may not be shown here. The structural components such as transistors and capacitors may be disposed in a manner referring to the embodiments associated with FIG. 4 and FIG. 9. Other structural components included in the film layer structures of the display panel may be disposed according to practical applications. In addition, FIG. 10 and FIG. 11 may not illustrate the electrical connection relationship between the first anode 121 and the structural component disposed in the film layer structure facing towards the substrate 11. The electrical connection between the first anode 121 and the structural component in the film layer structure may be determined according to practical applications, which may not be limited by the present disclosure. The electrical connection between the first anode 121 and the reflection compensation structure 20 shown in FIG. 4 and FIG. 9 may merely be examples, which may not be limited by the present disclosure.

It should be noted that along the direction perpendicular to the plane where the substrate 11 is located, a depth of the first through-hole 61 may be in a range approximately between 1 μm-2 μm, which may ensure that the overall thickness of the display panel 100 is as small as possible, to realize the requirements for a substantially thin display panel 100.

Figure 12:
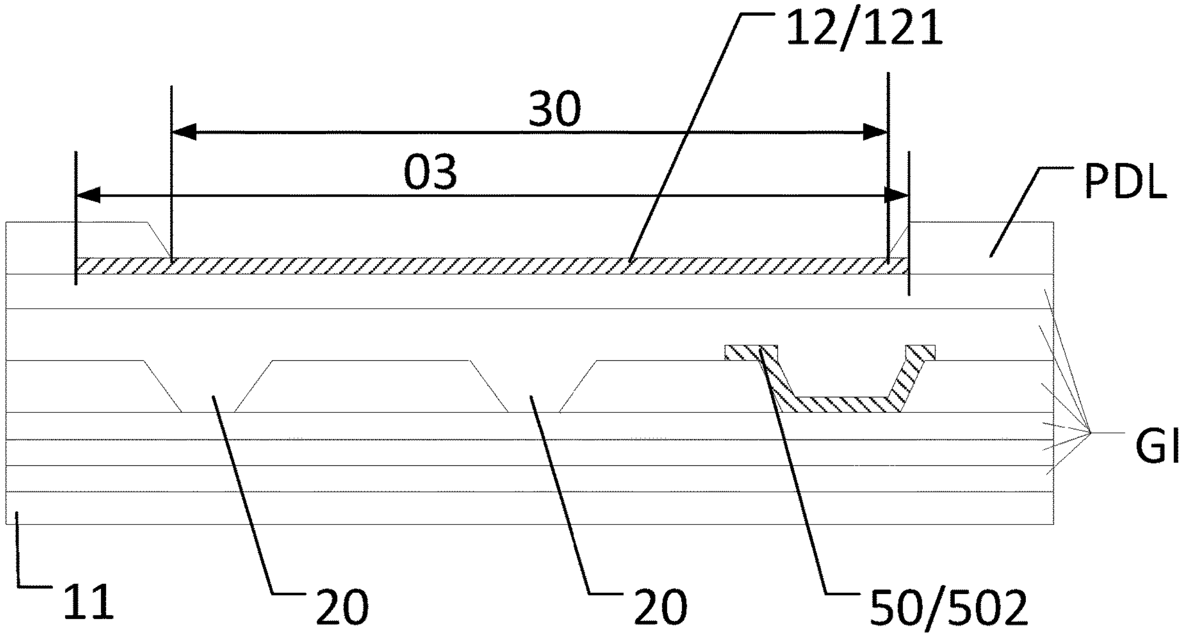
FIG. 12 illustrates another VV'-sectional view of the display panel in FIG. 2 consistent with disclosed embodiments of the present disclosure.

FIG. 12 illustrates another VV'-sectional view of the display panel in FIG. 2 consistent with disclosed embodiments of the present disclosure. Referring to FIG. 2, FIG. 4 and FIG. 9-12, in one embodiment, the reflection compensation structure 20 may include a plate structure, a hole structure, or a block structure overlapped with the through-hole.

In one embodiment, the reflection compensation structure 20 may include the plate structure, the hole structure, or the block structure overlapped with the through-hole. Referring to FIG. 9, the plate structure may refer to that the reflection compensation structure 20 has a planar shape, and the plane where the reflection compensation structure 20 is located may be parallel to the plane where the substrate 11 is located. Referring to FIG. 12, the hole structure may refer to that the reflection compensation structure 20 may include a hole structure (a groove structure with a certain thickness) formed in an insulating layer. Referring to FIG. 10 and FIG. 11, the block structure overlapped with the through-hole may refer to that the reflection compensation structure 20 includes a structural block with a depression.

It should be noted that the above three structures of the reflection compensation structure 20 may merely be examples of the present disclosure, which may not be limited by the present disclosure. The specific disposure of the reflection compensation structure 20 may be determined according to practical applications.

In one embodiment, referring to FIG. 9, the reflection compensation structure 20 and the conductive pad 50 may be correspondingly disposed in the region 03 where the first anode 121 is located, and each conductive pad 50 may have a plate structure. In view of this, the reflection compensation structure 20 may also have a plate structure, such that the reflection compensation structure 20 and the conductive pad 50 may have the same reflection effect on the incident light, which may facilitate to improve the display uniformity of the display panel 100.

In another embodiment, referring to FIG. 11, the reflection compensation structure 20 and the conductive pad 50 may be correspondingly disposed in the region 03 where the first anode 121 is located, and each conductive pad 50 may have a concave structure. In view of this, the reflection compensation structure 20 may also have a concave structure (the block structure overlapped with the through-hole), such that the reflection compensation structure 20 and the conductive pad 50 may have the same reflection effect on the incident light, which may facilitate to improve the display uniformity of the display panel 100.

In certain embodiments, the reflection compensation structure 20 and the conductive pad 50 may be correspondingly disposed in the region 03 where the first anode 121 is located, and each conductive pad 50 may have a recessed hole underneath. In view of this, the reflection compensation structure 20 may also have a recessed hole underneath, and both the reflection compensation structure 20 and the conductive pad 50 may have a risk of being recessed towards the substrate 11, such that the reflection compensation structure 20 and the conductive pad 50 may have the same reflection effect on the incident light, which may facilitate to improve the display uniformity of the display panel 100.

It should be noted that FIG. 12 may merely illustrate the substrate 11, the first anode 121, the conductive pad 50 and the reflection compensation structure 20 included in the film layer structures of the display panel. The other unmarked film layer structures on the side of the first anode 121 facing towards the substrate 11 may include certain insulating layers GI. The structural components such as transistors and capacitors that may be included between the first anode 121 and the substrate 11 may not be shown here. The structural components such as transistors and capacitors may be disposed in a manner referring to the embodiments associated with FIG. 4 and FIG. 9. Other structural components included in the film layer structures of the display panel may be disposed according to practical applications. In addition, FIG. 12 may not illustrate the electrical connection relationship between the first anode 121 and the structural component disposed in the film layer structure facing towards the substrate 11. The electrical connection between the first anode 121 and the structural component in the film layer structure may be determined according to practical applications, which may not be limited by the present disclosure. The electrical connection between the first anode 121 and the reflection compensation structure 20 shown in FIG. 4 and FIG. 9 may merely be examples, which may not be limited by the present disclosure.

Referring to FIG. 2, in one embodiment, the reflection compensation structure 20 may be floated or may be electrically connected to the signal line.

In one embodiment, when the reflection compensation structure 20 is provided in the display panel 100, at least a portion of the reflection compensation structures 20 may not be electrically connected to the structural components required to transmit electrical signals when the display panel is in operation. In other words, there are redundant reflection compensation structures 20 that are not used for the display function of the display panel. In view of this, such reflection compensation structures 20 may be floated, and may merely be configured to combine with the conductive pad 50 disposed in the corresponding region 03, to balance the reflection effect on light of the region 03 where the corresponding first anode 121 is located, and to improve the display uniformity of the display panel 100. In addition, the reflection compensation structure 20 may be electrically connected to certain fixed potential signal line. For example, the idle reflection compensation structure 20 may be electrically connected to any one of the PVDD signal trace, the PVEE signal trace, and the Vref signal trace, to avoid the mura problem of the display panel 100.

Figure 13:
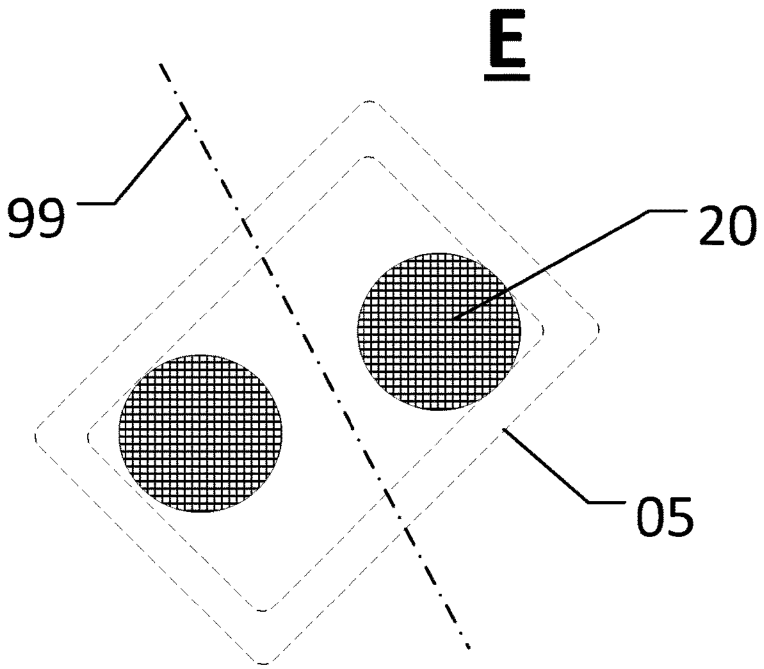
FIG. 13 illustrates a local zoom-in view of a region E of the display panel in FIG. 2 consistent with disclosed embodiments of the present disclosure.
Figure 14:
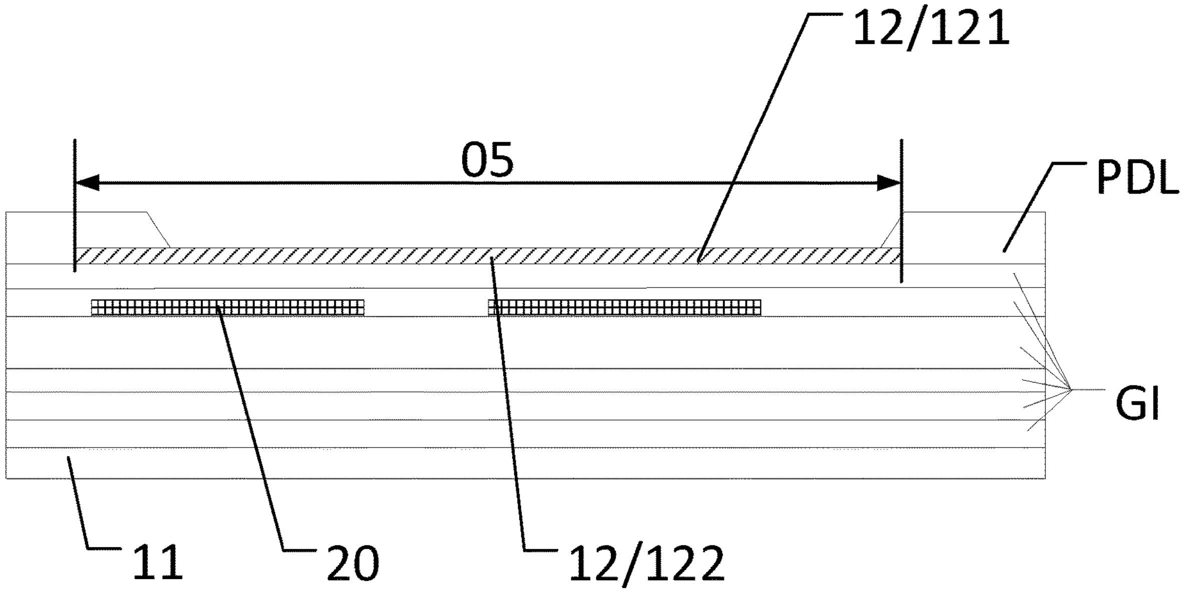
FIG. 14 illustrates an FF'-sectional view of the display panel in FIG. 2 consistent with disclosed embodiments of the present disclosure.

FIG. 13 illustrates a local zoom-in view of a region E of the display panel in FIG. 2 consistent with disclosed embodiments of the present disclosure; and FIG. 14 illustrates an FF'-sectional view of the display panel in FIG. 2 consistent with disclosed embodiments of the present disclosure. Referring to FIG. 2, FIGS. 4-6, FIG. 13 and FIG. 14, in one embodiment, the display panel may further include the conductive pad 50. Along the direction perpendicular to the plane where the substrate 11 is located, the conductive pad 50 may overlap with the first anode 121, and may be located on the side of the first anode 121 facing towards the substrate 11.

The anodes 12 may also include a second anode 122. In the direction perpendicular to the plane where the substrate 11 is located, the second anode 122 may overlap with the reflection compensation structure 20, and may not overlap with the conductive pad 50. The reflection compensation structure 20 may be located on the side of the second anode 122 facing towards the substrate 11.

In the existing display panel, a region 01 may be provided with the wire-changing pads 02 that are uniformly or non-uniformly distributed, and another region 01 may not be provided with the wire-changing pads 02. To make the surface of the anode away from the substrate corresponding to the region 01 have equivalent reflection effect on incident light, a substantially great number of regions 01 provided with the conductive pads 50 and/or the reflection compensation structures 20 that are uniformly and/or symmetrically arranged as much as possible may need to be provided. Due to the disposure of the conductive pad 50 and/or the reflection compensation structure 20 in the substantially great number of regions 01, the surface of the anode away from the substrate may have almost the same reflection effect on incident light, thereby improving the display uniformity of the display panel.

In one embodiment, when the display panel 100 includes the conductive pad 50, along the direction perpendicular to the plane where the substrate 11 is located, the conductive pad 50 may overlap with the first anode 121, and the conductive pad 50 may be located on the side of the first anode 121 facing towards the substrate 11.

In one embodiment, the anodes 12 included in the display panel 100 may include multiple types of arrangement, for example, the anodes 12 may also include the second anode 122 in addition to the first anode 121. The difference between the second anode 122 and the first anode 121 may include that along the direction perpendicular to the plane where the substrate 11 is located, the second anode 122 may overlap with the reflection compensation structure 20, while may not overlap with the conductive pad 50. The reflection compensation structure 20 may be disposed on the side of the second anode 122 facing towards the substrate 11.

In one embodiment, the display panel 100 may simultaneously include both the first anode 121 and the second anode 122. The region 03 corresponding to the first anode 121 may be provided with the conductive pad 50, and the region corresponding to the second anode 122 may not be provided with the conductive pad 50. In view of this, the region 03 corresponding to the first anode 121 may be simultaneously provided with the reflection compensation structure 20 and the conductive pad 50. In another embodiment, the region 03 corresponding to the first anode 121 may be merely provided with the conductive pad 50, and the region 05 corresponding to the second anode 122 may be merely provided with the reflection compensation structure 20. In addition, in certain embodiments, the region 05 corresponding to the second anode 122 may not be provided with the reflection compensation structure 20.

The number, disposure position, area size, shape, etc., of the reflection compensation structures 20 and the conductive pads 50 included in the regions respectively corresponding to the first anode 121 and the second anode 122 may be determined according to practical applications, as long as in the most or all regions corresponding to the anodes 12 in the display panel 100, the conductive pads 50 and/or the reflection compensation structures 20 are uniformly and/or symmetrically arranged as much as possible. The surface of the anode 12 away from the substrate 11 may have substantially uniformly or symmetrically disposed slight protrusions or slight depressions. Therefore, the surface of the anode 12 away from the substrate 11 may have a substantially uniform reflection effect on incident light. The color shift problem existing in the display panel may be reduced or even avoided, and the display uniformity of the display panel 100 may be improved.

It should be noted that FIG. 14 may merely illustrate the substrate 11, the first anode 121, and the reflection compensation structure 20 included in the film layer structures of the display panel. The other unmarked film layer structures on the side of the first anode 121 facing towards the substrate 11 may include certain insulating layers GI. The structural components such as transistors and capacitors that may be included between the first anode 121 and the substrate 11 may not be shown here. The structural components such as transistors and capacitors may be disposed in a manner referring to the embodiments associated with FIG. 4 and FIG. 9. Other structural components included in the film layer structures of the display panel may be disposed according to practical applications. In addition, FIG. 14 may not illustrate the electrical connection relationship between the first anode 121 and the structural component disposed in the film layer structure facing towards the substrate 11. The electrical connection between the first anode 121 and the structural component in the film layer structure may be determined according to practical applications, which may not be limited by the present disclosure. The electrical connection between the first anode 121 and the reflection compensation structure 20 shown in FIG. 4 and FIG. 9 may merely be examples, which may not be limited by the present disclosure.

Figure 15:
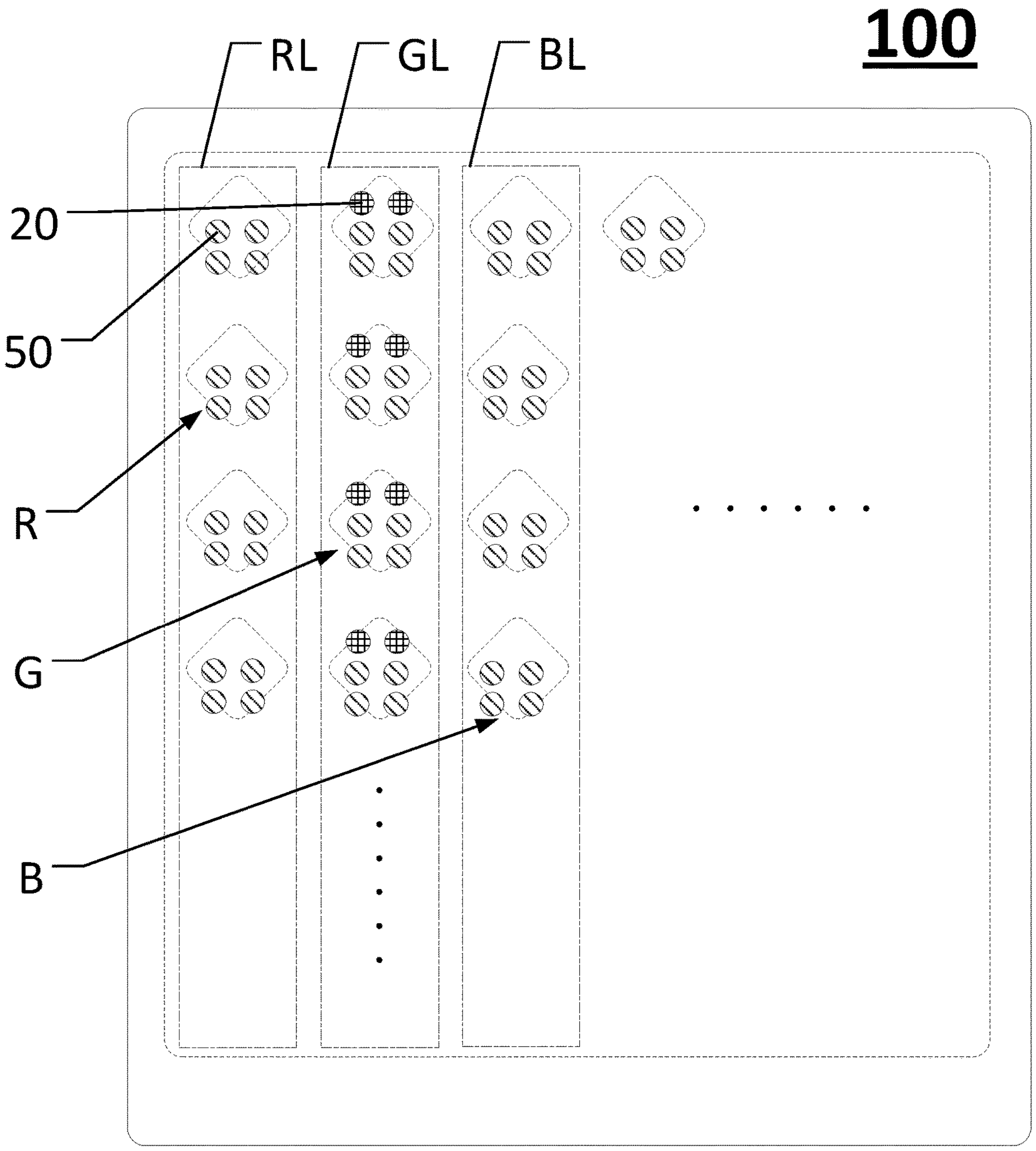
FIG. 15 illustrates a top view of another exemplary display panel consistent with disclosed embodiments of the present disclosure.

FIG. 15 illustrates a top view of another exemplary display panel consistent with disclosed embodiments of the present disclosure. Referring to FIGS. 2-13 and FIG. 15, the display panel may further include a green pixel G. The green pixel G may include the first anode 121.

In one embodiment, the display panel 100 may include at least three pixel types, such as a red pixel R, the green pixel G, and a blue pixel B. Referring to FIG. 15, the display panel may include a red pixel row RL, a green pixel row GL, and a blue pixel row BL. If the apertures of the red pixel R, the green pixel G, and the blue pixel B are equal in size, the luminous brightness of the green pixel G may be the largest. When the surface of the anode 12 away from the substrate 11 in the region corresponding to the opening region of each color pixel unit has a problem of different reflection effects in different regions, the display difference corresponding to the green pixel G may be the most obvious. In view of this, if the conductive pad 50 and/or the reflection compensation structure 20 are merely disposed in the region 03 corresponding to the anode 12, the region where the anode 12 (the first anode 121) corresponding to the green pixel G is located may be simultaneously provided with the conductive pad 50 and the reflection compensation structure 20. The reflection compensation structure 20 and the conductive pad 50 may be uniformly or symmetrically disposed as much as possible in the region corresponding to the first anode 121, such that a portion of the region 03 where the first anode 121 of the green pixel G is located and correspondingly provided with the reflection compensation structure 20 and the conductive pad 50 may have the equivalent reflection effect on the incident light. Therefore, the surface of the first anode 121 away from the substrate 11 may have a substantially uniform reflection effect on the incident light. The situation where different regions of the first anode 121 have obvious differences in the reflection effect on the incident light may be prevented. Therefore, the color shift problem existing in the display region corresponding to the first anode 121 may be reduced or even avoided, and the display uniformity of the display panel 100 may be improved.

Figure 16:
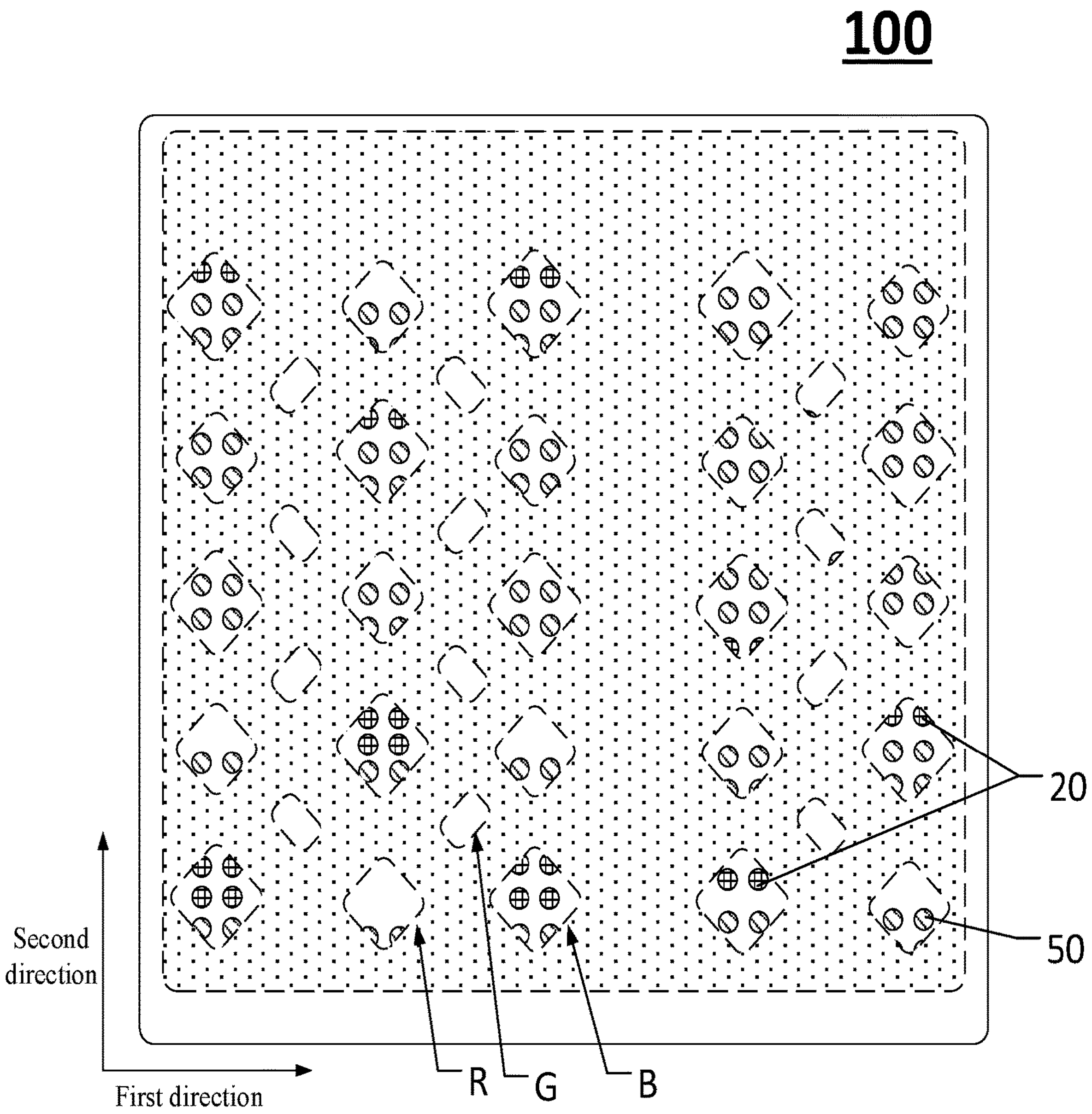
FIG. 16 illustrates a top view of another exemplary display panel consistent with disclosed embodiments of the present disclosure.

FIG. 16 illustrates a top view of another exemplary display panel consistent with disclosed embodiments of the present disclosure. Referring to FIGS. 2-13 and FIG. 16, in one embodiment, the display panel may further include at least three pixel types, such as the red pixel R, the green pixel G, and the blue pixel B. If the aperture area of the red pixel R is substantially small, the aperture area of the green pixel G is smallest, and the aperture area of the blue pixel B is largest, when the region corresponding to the opening region of each color pixel unit has a problem of different reflection effects in different regions, because the aperture area of each pixel is different, the blue pixel B with the largest aperture area may have the largest display difference, the red pixel R may have the second largest display difference, and the green pixel G may have the smallest display difference. In view of this, if the conductive pad 50 and/or the reflection compensation structure 20 are merely disposed in the region 03 corresponding to the anode 12, at least the anodes 12 corresponding to the blue pixel B may include the first anode 121. In other words, the region where the anode 12 (the first anode 121) corresponding to the blue pixel B is located may be simultaneously provided with the conductive pad 50 and the reflection compensation structure 20. The reflection compensation structure 20 and the conductive pad 50 may be uniformly or symmetrically disposed as much as possible in the region 03 corresponding to the first anode 121, such that a portion of the region 03 where the first anode 121 is located and correspondingly provided with the reflection compensation structure 20 and the conductive pad 50 may have the equivalent reflection effect on incident light. Therefore, the surface of the first anode 121 away from the substrate 11 may have a substantially uniform reflection effect on incident light. The situation where different regions of the first anode 121 have obvious differences in the reflection effect on the incident light may be prevented. Therefore, the color shift problem existing in the display region corresponding to the first anode 121 may be reduced or even avoided, and the display uniformity of the display panel 100 may be improved.

It should be noted that when the aperture area of the red pixel R is substantially small, the aperture area of the green pixel G is the smallest, and the aperture area of the blue pixel B is the largest, the surface of the first anode 121 away from the substrate 11 of the blue pixel B may be provided with the reflection compensation structure 20 and the conductive pad 50 that are uniformly or symmetrically disposed as much as possible. Therefore, the color shift problem existing in the region 03 in display panel 100 may be reduced or even avoided, which may improve the display effect of the display panel 100 to a certain extent.

Similarly, in another embodiment, the region 03 corresponding to at least one, or two, or all of the red pixel R, the green pixel G, and the blue pixel B may be provided with the reflection compensation structure 20 and/or the conductive pad 50. The reflection compensation structure 20, and/or the conductive pad 50, and/or the wire-changing pad may be uniformly or symmetrically disposed as much as possible in such region. Therefore, the surface of the anode 12 away from the substrate 11 corresponding to a substantially large number of pixels may have equivalent reflection effect on incident light, and the display effect of the display panel may be improved.

Referring to FIG. 2, FIG. 13 and FIG. 14, in one embodiment, along the direction perpendicular to the plane where the substrate 11 is located, the reflection compensation structures 20 overlapped with a same second anode 122 may be symmetrically located in the region corresponding to the second anode 122.

In one embodiment, along the direction perpendicular to the plane where the substrate 11 is located, the reflection compensation structure 20 overlapped with the same second anode 122 may be symmetrically located in the region corresponding to the second anode 122. The region corresponding to the second anode 122 may not be provided with the conductive pad 50, and may merely be provided with the reflection compensation structure 20. The reflection compensation structure 20 may be symmetrically located with respect to a symmetry axis 99 in the region corresponding to the second anode 122, such that the reflection compensation structure 20 may be symmetrically located in the region corresponding to the second anode 122. Therefore, due to the existence of the reflection compensation structure 20, the surface of the second anode 122 away from the substrate 11 may have substantially slight protrusions or slight depressions that are symmetrically disposed as much as possible. Therefore, the surface of the second anode 122 away from the substrate 11 may have a substantially uniform reflection effect on incident light. The situation where different regions of the second anode 122 have obvious differences in the reflection effect on the incident light may be prevented. Therefore, the color shift problem existing in the display region corresponding to the second anode 122 may be reduced or even avoided, and the display uniformity of the display panel 100 may be improved.

It should be noted that in addition to the embodiment associated with FIG. 13, the reflection compensation structure 20 in the region where the second anode 122 is located may be symmetrically arranged along the first direction and/or along the second direction, which may not be limited by the present disclosure. The disposure of the corresponding reflection compensation structure 20 may be determined according to the shape and disposure direction of the pixel opening region corresponding to the second anode 122.

Referring to FIGS. 2-7, in one embodiment, along the direction perpendicular to the plane where the substrate 11 is located, the conductive pad 50 and the reflection compensation structure 20 that overlap with the same first anode 121 may be symmetrically arranged in the region 03 corresponding to the first anode 121.

In one embodiment, when the region 03 where the first anode 121 is located is correspondingly provided with the conductive pad 50 and the reflection compensation structure 20, along the direction perpendicular to the plane where the substrate 11 is located, the conductive pad 50 and the reflection compensation structure 20 together may be symmetrically arranged as much as possible in the region 03 corresponding to the first anode 121. Therefore, due to the existence of the reflection compensation structure 20 and the conductive pad 50, the surface of the first anode 121 away from the substrate 11 may have substantially slight protrusions or slight depressions that are symmetrically disposed as much as possible. The surface of the first anode 121 away from the substrate 11 may have a substantially uniform reflection effect on incident light. The situation where different regions of the first anode 121 have obvious differences in the reflection effect on the incident light may be prevented. Therefore, the color shift problem existing in the display region corresponding to the first anode 121 may be reduced or even avoided, and the display uniformity of the display panel 100 may be improved.

It should be noted that the reflection compensation structure 20 and the conductive pad 50 in the region 03 where the first anode 121 is located may be symmetrically arranged along the first direction and/or along the second direction, which may not be limited by the present disclosure. The disposure of the corresponding reflection compensation structure 20 and the conductive pad 50 may be determined according to the shape and disposure direction of the pixel opening region corresponding to the first anode 121.

Figure 17:
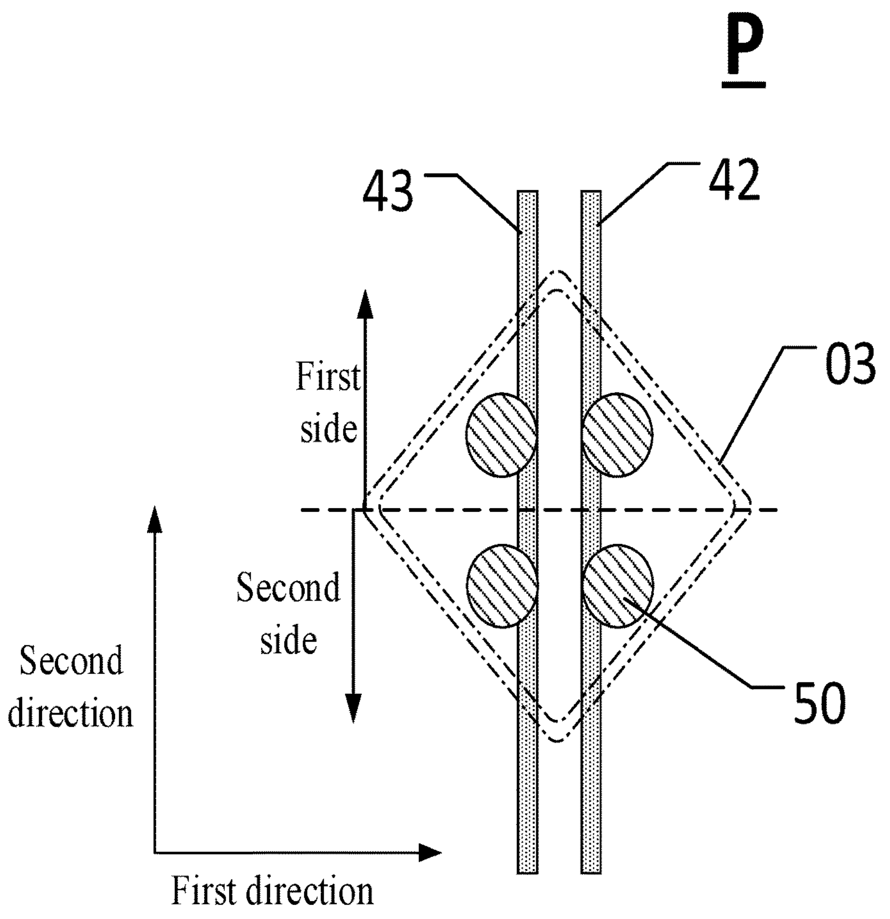
FIG. 17 illustrates a local zoom-in view of a region P of the display panel in FIG. 2 consistent with disclosed embodiments of the present disclosure.
Figure 18:
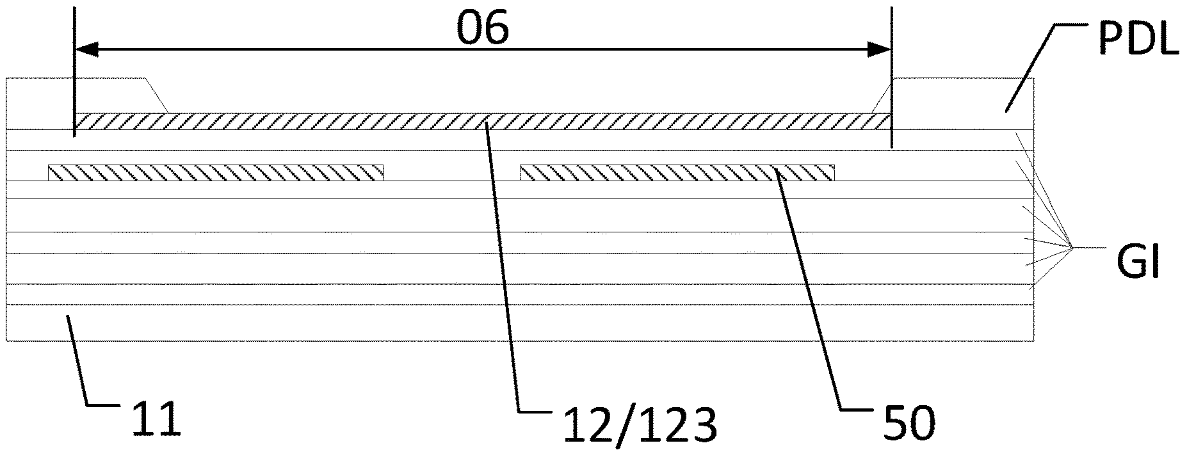
FIG. 18 illustrates a KK'-sectional view of the display panel in FIG. 2 consistent with disclosed embodiments of the present disclosure.

FIG. 17 illustrates a local zoom-in view of a region P of the display panel in FIG. 2 consistent with disclosed embodiments of the present disclosure; and FIG. 18 illustrates a KK'-sectional view of the display panel in FIG. 2 consistent with disclosed embodiments of the present disclosure. Referring to FIG. 2, FIG. 17 and FIG. 18, in one embodiment, the display panel may further include the conductive pad 50.

The anodes 12 may also include a third anode 123. Along the direction perpendicular to the plane where the substrate 11 is located, the conductive pad 50 may overlap with the third anode 123 and may not overlap with the reflection compensation structure 20. The conductive pad 50 may be located on a side of the third anode 123 facing towards the substrate 11.

In one embodiment, along the direction perpendicular to the plane of the substrate 11, the conductive pad 50 overlapped with a same third anode 123 may be symmetrically arranged in the region corresponding to the third anode 123. In one embodiment, the display panel may include the conductive pad 50 and the anode 12. The anode 12 may include the third anode 123. Along the direction perpendicular to the plane where the substrate 11 is located, the conductive pad 50 may overlap with the third anode 123 and may not overlap with the reflection compensation structure 20. The conductive pad 50 may be located on the side of the third anode 123 facing towards the substrate 11. The display panel 100 may include a kind of third anode 123. The region 06 corresponding to the third anode 123 may not be provided with the reflection compensation structure 20, and may be merely provided with the conductive pad 50. The conductive pad 50 may be symmetrically or uniformly arranged as much as possible in the region 06 corresponding to the third anode 123. After the region corresponding to the side of the third anode 123 away from the substrate 11 receives the incident light from the side of the light-emitting surface of the display panel 100, the region corresponding to the side of the third anode 123 away from the substrate 11 may have similar reflection effect on the incident light and may not have obvious difference. Therefore, the region corresponding to the third anode 123 may not have the color shift problem during display, such that the reflection compensation structure 20 may not need to be added in such region.

It should be noted that when the region corresponding to an anode 12 is provided with the conductive pad 50 and/or the reflection compensation structure 20, the total area of the corresponding conductive pad 50 and/or the reflection compensation structure 20 disposed in the region where the anode 12 is located and exposed by the opening region may be equal to or less than 80% of the area of the opening region corresponding to the anode 12, to ensure that there is a space between the adjacent conductive pads 50 and/or the reflection compensation structures 20. A connection problem may be prevented, and the problem of signal crosstalk may be prevented, which may ensure the normal operation of the display panel 100. In addition, the spacing between the conductive pads 50 and/or the reflection compensation structures 20 in the region corresponding to the anode 12 may be in a range approximately between 2.5 μm-3.5 μm, which may avoid the occurrence of the connection problem and the signal crosstalk problem, to ensure the normal operation of the display panel 100.

In addition, it should be noted that the conductive pad 50 and/or the reflection compensation structure 20 disposed in the region corresponding to the anode 12 may have the same shape, such as circle, ellipse, etc., and may have the same area. The above-mentioned embodiment is merely an optional example of the conductive pad 50 and/or the reflection compensation structure 20, which may not be limited by the present disclosure. The shape, area, etc., of the reflection compensation structure 20 and/or the conductive pad 50 may be adjusted according to practical applications.

It should be noted that FIG. 18 may merely illustrate the substrate 11, the first anode 121, the conductive pad 50 and the reflection compensation structure 20 included in the film layer structures of the display panel. The other unmarked film layer structures on the side of the first anode 121 facing towards the substrate 11 may include certain insulating layers GI. The structural components such as transistors and capacitors that may be included between the first anode 121 and the substrate 11 may not be shown here. The structural components such as transistors and capacitors may be disposed in a manner referring to the embodiments associated with FIG. 4 and FIG. 9. Other structural components included in the film layer structures of the display panel may be disposed according to practical applications. In addition, FIG. 18 may not illustrate the electrical connection relationship between the first anode 121 and the structural component disposed in the film layer structure facing towards the substrate 11. The electrical connection between the first anode 121 and the structural component in the film layer structure may be determined according to practical applications, which may not be limited by the present disclosure. The electrical connection between the first anode 121 and the reflection compensation structure 20 shown in FIG. 4 and FIG. 9 may merely be examples, which may not be limited by the present disclosure.

Figure 19:
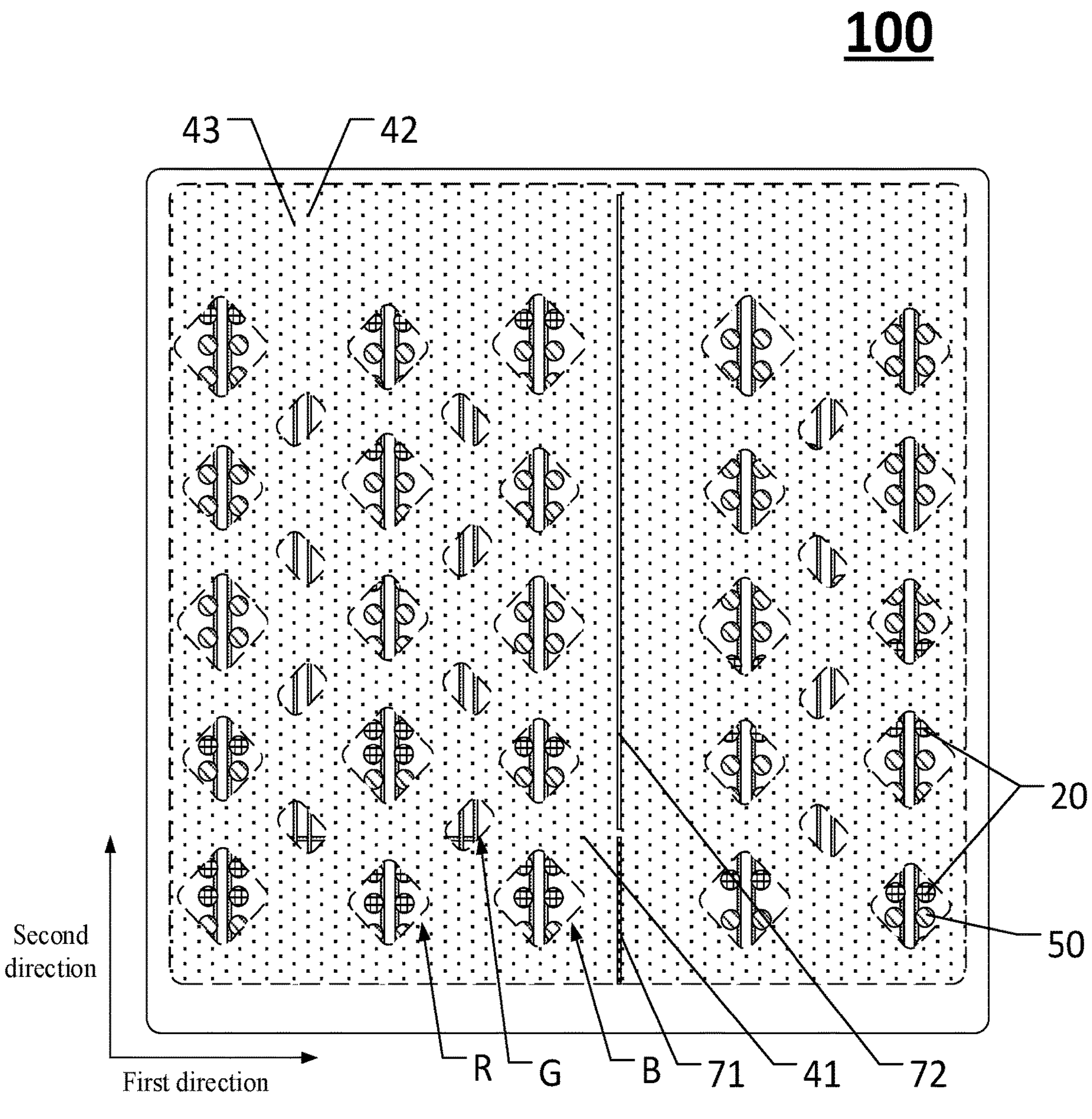
FIG. 19 illustrates a top view of another exemplary display panel consistent with disclosed embodiments of the present disclosure.

FIG. 19 illustrates a top view of another display panel consistent with disclosed embodiments of the present disclosure. Referring to FIG. 19, in one embodiment, the display panel 100 may further include the first signal trace 41 extended along the first direction, and the second signal trace 42 and a first sub-trace 71 extended along the second direction. The first direction may intersect the second direction. The first signal trace 41 may be electrically connected to the first sub-trace 71 for transmitting an electrical signal to the second signal trace 42.

The display panel 100 may further include a second sub-trace 72 one-to-one corresponding to the first sub-trace 71. An extension direction of the second sub-trace 72 may be the same as an extension direction of the first sub-trace 71. The second sub-trace 72 may be floated or electrically connected to a signal line.

In one embodiment, the display panel 100 may further include the first signal trace 41 extended along the first direction, and the second signal trace 42 and the first sub-trace 71 extended along the second direction. The first signal trace 41 may be electrically connected to the first sub-trace 71 for transmitting an electrical signal to the second signal trace 42, where the second signal trace 42 may be configured as the data signal line. The data signal line may not be directly electrically connected to the driving chip, and may receive the data signal sent by the driving chip through the first signal trace 41 and the first sub-trace 71. In view of this, the display panel 100 may further include the second sub-trace 72 one-to-one corresponding to the first sub-trace 71, and the extension direction of the second sub-trace 72 may be the same as the extension direction of the first sub-trace 71. The second sub-trace 72 may be disposed on the side of the first sub-trace 71 away from the driving chip electrically connected thereto. In view of this, the number of traces in each region of the display panel 100 may be equal. If the trace has a reflection effect on the light incident on the display panel 100, the reflection effect of the entire display panel 100 on the external light may be almost the same. The situation where different regions of the display panel 100 have obvious differences in the reflection effect on the incident light may be prevented. Therefore, the color shift problem existing in the display region may be reduced or even avoided, and the display uniformity of the display panel 100 may be improved.

In addition, when the second sub-trace 72 is disposed in the display panel 100, the second sub-trace 72 may be floated or may be electrically connected to the signal line. When the second sub-trace 72 is electrically connected to the signal line, the second sub-trace 72 may be electrically connected to a certain fixed potential signal line. For example, the second sub-trace 72 may be electrically connected to any one of the PVDD signal wire, PVEE signal wire, and Vref signal wire, to avoid the mura problem of the display panel 100.

It should be noted that in one embodiment, in the right-most column of pixels in FIG. 19, the added reflection compensation structure 20 may be located on the lower side of the conductive pad 50 or the wire-changing pad, instead of being located on the upper side of the conductive pad 50 or the wire-changing pad. In other words, as long as the wire-changing pad and/or the reflection compensation structure 20 and/or the conductive pad 50 are symmetrically arranged in the region corresponding to the anode 12, the surface of the anode 12 away from the substrate 11 may have a substantially uniform reflection effect on the incident light. The situation where different regions of the display panel 100 have obvious differences in the reflection effect on the incident light may be prevented. Therefore, the color shift problem existing in the display region may be reduced or even avoided, and the display uniformity of the display panel 100 may be improved.

Referring to FIG. 2 and FIG. 4, in one embodiment, along the direction perpendicular to the plane where the substrate 11 is located, the display panel 100 may further include at least a first metal layer and a second metal layer M2 that are disposed between the substrate 11 and the anode 12. The second metal layer M2 may be located between the first metal layer and the anode 12. The conductive pad 50 and at least part of the reflection compensation structure 20 may be formed in the second metal layer M2.

In one embodiment, along the direction perpendicular to the plane where the substrate 11 is located, the display panel 100 may include the first metal layer and the second metal layer M2 that are disposed between the substrate 11 and the anode 12. The second metal layer M2 may be disposed between the first metal layer and the anode 12. In view of this, if the conductive pad 50 and/or the reflection compensation structure 20 are disposed in the display panel 100, the conductive pad 50 and/or the reflection compensation structure 20 may be formed in the second metal layer M2 when being arranged in the same layer. In other words, the conductive pad 50 and/or the reflection compensation structure 20 may be disposed substantially close to the anode 12, such that the conductive pad 50 and/or the reflection compensation structure 20 may have a substantially obvious impact of on the flatness of the surface of the anode 12 away from the substrate 11. Therefore, the surfaces of a substantially large number of anodes 12 away from the substrate 11 may have substantially similar reflection effect on incident light. The situation where different regions of the display panel have obvious differences in the reflection effect on the incident light may be prevented, to ensure the display uniformity of the display panel 100.

It should be noted that in one embodiment, in the film layer structures of the display panel shown in FIG. 4, the insulating layers GI between the substrate 11 and the anode 12 may include the first metal material layer L1, the capacitor metal layer L0, the second metal material layer L2, the third metal material layer L3, and the fourth metal material layer L4, etc. The third metal material layer L3 may be multiplexed as the above-mentioned second metal layer M2 for disposing the conductive pad 50 and/or the reflection compensation structure 20. Any one of the first metal material layer L1, the capacitor metal layer L0, and the second metal material layer L2 may be multiplexed as the above-mentioned first metal layer. The conductive pad 50 and at least part of the reflection compensation structure 20 may be formed in the second metal layer M2, in other words, the conductive pad 50 and at least part of the reflection compensation structure 20 may be disposed substantially close to the anode 12. Therefore, the conductive pad 50 and/or the reflection compensation structure 20 may have a substantially obvious impact of on the flatness of the surface of the anode 12 away from the substrate 11. The surfaces of a substantially large number of anodes 12 away from the substrate 11 may have substantially similar reflection effect on incident light. The situation where different regions of the display panel have obvious differences in the reflection effect on the incident light may be prevented, to ensure the display uniformity of the display panel 100.

Furthermore, in one embodiment, when the display panel 100 includes the substrate 11, the first metal layer, the second metal layer M2, and the anode 12 with the above structure, the wire-changing pad, and/or the conductive pad, and/or the reflection compensation structure disposed in the region corresponding to the anode 12 may have a concave structure in the second metal layer M2 recessed towards the substrate 11. Compared to the first metal layer and the wire-changing pad, and/or the conductive pad, and/or the reflection compensation structure that are disposed substantially close to the substrate 11, the concave structure of the wire-changing pad, and/or the conductive pad, and/or the reflection compensation structure that are formed by recessing the second metal layer M2 towards the substrate 11 may be likely to cause slight unevenness of the surface of the anode 12 away from the substrate 11 in the corresponding region. Therefore, the wire-changing pad, and/or the conductive pad, and/or the reflection compensation structure may be located in the second metal layer M2, the color shift problem of the display panel 100 may be prevented, which may further improve the display uniformity of the display panel 100.

Referring to FIG. 2 and FIG. 4, in one embodiment, the display panel may further include a pixel definition layer PDL. The pixel definition layer PDL may be disposed on the side of the anode 12 away from the second metal layer M2.

The display panel may further include the plurality of pixel opening regions 30. The plurality of pixel opening regions 30 may penetrate through the pixel definition layer PDL, and may expose the anode 12.

In one embodiment, the display panel 100 may include the pixel definition layer PDL, and the pixel definition layer PDL may be disposed on the side of the anode 12 away from the second metal layer M2. The pixel opening region 30 in the display panel 100 may be formed by penetrating through the pixel definition layer PDL to expose the anode 12. In the pixel opening region 30, the light-emitting layer 125 and the cathode 126 may be disposed on the side of the anode 12 away from the substrate 11, to realize the fabrication of the light-emitting component.

Figure 20:
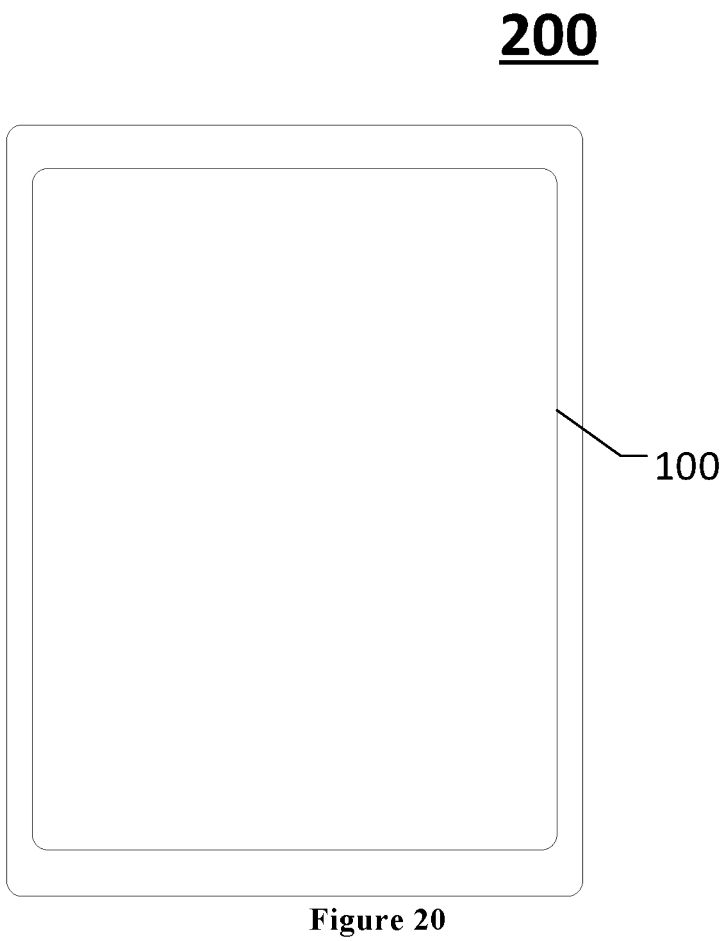
FIG. 20 illustrates a schematic diagram of an exemplary display device consistent with disclosed embodiments of the present disclosure.

The present disclosure also provides a display device. FIG. 20 illustrates a schematic diagram of a display device consistent with disclosed embodiments of the present disclosure. Referring to FIG. 20 and in conjunction with FIGS. 1-19, a display device 200 may include a display panel 100. The display panel 100 may include a display panel 100 in any one of the disclosed embodiments.

It should be noted that the embodiments of the display device 200 in the present disclosure may refer to the above-disclosed embodiments of the display panel 100, which may not be repeated herein. The display device 200 may include any product and component with a display function, such as a mobile phone, a tablet computer, a television, a monitor, a notebook computer, and a navigator, etc.

The disclosed display panel and display device may have following beneficial effects. In the disclosed display panel and display device, the reflection compensation structure may be disposed in the display panel to balance the reflection effect on the incident external light of the region where the first anode is located, such that the reflection effect on the incident external light of each region where the first anode is located may be substantially uniform. The situation where different regions of the first anode have obvious differences in the reflection effect on the incident light may be prevented. Therefore, the color shift problem existing in the display region corresponding to the first anode may be reduced or even avoided, and the display uniformity of the display panel may be improved.

The description of the disclosed embodiments is provided to illustrate the present disclosure to those skilled in the art. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments illustrated herein but is to be accorded the widest scope consistent with the principles and novel features disclosed herein.

What is claimed is:

1. A display panel, comprising:
- a substrate,
- a plurality of anodes disposed on a side of the substrate, and
- one or more dedicated reflection compensation structures configured to balance reflection effects on incident light, wherein:
  - the plurality of anodes include a first anode,
  - along a direction perpendicular to a plane where the substrate is located, the first anode overlaps with a reflection compensation structure of the one or more dedicated reflection compensation structures, wherein the reflection compensation structure is specifically positioned to compensate for asymmetric distribution of one or more conductive pads beneath the first anode, the one or more conductive pads include at least one conductive pad electrically connected to a signal trace via a through-hole, the reflection compensation structure is positioned on a first side of a region corresponding to the first anode while the at least one conductive pad is concentrated on a second side of the region corresponding to the first anode opposite to the first side, and the reflection compensation structure is distinct from the one or more conductive pads or functional signal traces, and
  - the reflection compensation structure is disposed on a side of the first anode facing towards the substrate.

2. The display panel according to claim 1, further including:
- a plurality of pixel opening regions, wherein:
  - the plurality of pixel opening regions include a first pixel opening region, and
  - along the direction perpendicular to the plane where the substrate is located, the reflection compensation structure overlaps with the first pixel opening region.

3. The display panel according to claim 1, further including:
- a first signal trace extended along a first direction and a second signal trace extended along a second direction, wherein:
  - the first direction intersects the second direction, along the direction perpendicular to the plane where the substrate is located, the first signal trace overlaps with the first anode and is located on the side of the first anode facing towards the substrate, and the reflection compensation structure is at least located on a first side of the first signal trace along the second direction.

4. The display panel according to claim 3, wherein:

along the direction perpendicular to the plane where the substrate is located, a conductive pad of the one or more conductive pads overlaps with the first anode, and is located on the side of the first anode facing towards the substrate, at least one conductive pad of the one or more conductive pads is located on a second side of the first signal trace along the second direction, wherein the first side of the first signal trace is opposite to the second side of the first signal trace, and/or along the direction perpendicular to the plane where the substrate is located, at least one conductive pad of the one or more conductive pads overlaps with the first signal trace.

5. The display panel according to claim 4, further including:

a third signal trace, wherein:

the third signal trace and the second signal trace are extended in a same direction and disposed on a same layer, and the conductive pad is electrically connected to one of the second signal trace and the third signal trace.

6. The display panel according to claim 5, wherein:

the reflection compensation structure is electrically connected to one of the second signal trace and the third signal trace.

7. The display panel according to claim 4, wherein:

the reflection compensation structure is disposed on a same layer as the conductive pad.

8. The display panel according to claim 4, further including:

a first through-hole, wherein:

the one or more conductive pads include a first conductive pad and a second conductive pad, and the first through-hole is in contact with the first conductive pad, and is disposed on a side of the first conductive pad facing towards the substrate.

9. The display panel according to claim 1, wherein:

the reflection compensation structure includes a plate structure, a hole structure, or a block structure overlapped with the through-hole.

10. The display panel according to claim 1, wherein:

the reflection compensation structure is floated or is electrically connected to a signal line.

11. The display panel according to claim 1, wherein:

along the direction perpendicular to the plane where the substrate is located, at least one conductive pad of the one or more conductive pads overlaps with the first anode, and is located on the side of the first anode facing towards the substrate, the plurality of anodes include a second anode, and along the direction perpendicular to the plane where the substrate is located, the second anode overlaps with at least one reflection compensation structure of the one or more dedicated reflection compensation structures and does not overlap with any of the one or more conductive pads, and the at least one reflection compensation structure is located on a side of the second anode facing towards the substrate.

12. The display panel according to claim 11, further including:

a green pixel, wherein the green pixel includes the first anode.

13. The display panel according to claim 11, wherein:

along the direction perpendicular to the plane where the substrate is located, the one or more reflection compensation structures overlapped with a same second anode are symmetrically located in a region corresponding to the same second anode such that the second anode has substantially uniform reflection effect on incident light across the region.

14. The display panel according to claim 4, wherein:

along the direction perpendicular to the plane where the substrate is located, at least one of the one or more conductive pads and at least one of the one or more reflection compensation structures that are overlapped with a same first anode together are symmetrically located in a region corresponding to the same first anode.

15. The display panel according to claim 1, wherein:

the plurality of anodes include a third anode, along the direction perpendicular to the plane where the substrate is located, the third anode overlaps with a conductive pad of the one or more conductive pads, and does not overlap with the reflection compensation structure, and the conductive pad is located on a side of the third anode facing towards the substrate.

16. The display panel according to claim 15, wherein:

along the direction perpendicular to the plane where the substrate is located, at least one of the one or more conductive pads overlapped with a same third anode is symmetrically located in a region corresponding to the same third anode.

17. The display panel according to claim 1, further including:

a first signal trace extended along a first direction, and a second signal trace and a first sub-trace that are extended along a second direction, wherein the first direction intersects the second direction, and the first signal trace is electrically connected to the first sub-trace for transmitting an electrical signal to the second signal trace, and a second sub-trace one-to-one corresponding to the first sub-trace, wherein an extension direction of the second sub-trace is the same as an extension direction of the first sub-trace, and the second sub-trace is floated or is electrically connected to a signal line.

18. The display panel according to claim 4, further including:

a first metal layer and a second metal layer that are disposed between the substrate and the first anode along the direction perpendicular to the plane where the substrate is located, wherein the second metal layer is located between the first metal layer and the first anode, and the conductive pad and at least one of the one or more reflection compensation structures are formed in the second metal layer.

19. The display panel according to claim 18, further including:

a pixel definition layer, wherein the pixel definition layer is disposed on a side of the first anode away from the second metal layer, and a plurality of pixel opening regions, wherein a pixel opening region of the plurality of pixel opening regions penetrates through the pixel definition layer, and exposes the first anode.

20. A display device, comprising:

a display panel, the display panel including:

a substrate, a plurality of anodes disposed on a side of the substrate, and one or more dedicated reflection compensation structures configured to balance reflection effects on incident light, wherein:

the plurality of anodes include a first anode, along a direction perpendicular to a plane where the substrate is located, the first anode overlaps with a reflection compensation structure of the one or more dedicated reflection compensation structures, wherein the reflection compensation structure is specifically positioned to compensate for asymmetric distribution of one or more conductive pads beneath the first anode, the one or more conductive pads include at least one conductive pad electrically connected to a signal trace via a through-hole, the reflection compensation structure is positioned on a first side of a region corresponding to the first anode while the at least one conductive pad is concentrated on a second side of the region corresponding to the first anode opposite to the first side, and the reflection compensation structure is distinct from the one or more conductive pads or functional signal traces, and the reflection compensation structure is disposed on a side of the first anode facing towards the substrate.

* * * * *